United States Patent
You et al.

(10) Patent No.: US 12,159,922 B2
(45) Date of Patent: Dec. 3, 2024

(54) METHOD OF FABRICATING SEMICONDUCTOR DEVICE

(71) Applicant: TAIWAN SEMICONDUCTOR MANUFACTURING CO., LTD., Hsinchu (TW)

(72) Inventors: Jia-Chuan You, Taoyuan (TW); Chia-Hao Chang, Hsinchu (TW); Tien-Lu Lin, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/301,704

(22) Filed: Apr. 17, 2023

(65) Prior Publication Data
US 2023/0253480 A1    Aug. 10, 2023

Related U.S. Application Data

(60) Continuation of application No. 17/681,588, filed on Feb. 25, 2022, now Pat. No. 11,631,749, which is a division of application No. 16/690,092, filed on Nov. 20, 2019, now Pat. No. 11,264,284.

(60) Provisional application No. 62/864,004, filed on Jun. 20, 2019.

(51) Int. Cl.
*H01L 29/66*     (2006.01)
*H01L 21/768*    (2006.01)
*H01L 21/8234*   (2006.01)
*H01L 29/417*    (2006.01)
*H01L 29/78*     (2006.01)

(52) U.S. Cl.
CPC ...... *H01L 29/6656* (2013.01); *H01L 21/7682* (2013.01); *H01L 21/823431* (2013.01); *H01L 21/823437* (2013.01); *H01L 29/41791* (2013.01); *H01L 29/66545* (2013.01); *H01L 29/6681* (2013.01); *H01L 29/785* (2013.01)

(58) Field of Classification Search
None
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,536,982 B1 | 1/2017 | Cheng |
| 9,548,366 B1 | 1/2017 | Ho et al. |

(Continued)

*Primary Examiner* — Feifei Yeung Lopez
(74) *Attorney, Agent, or Firm* — Maschoff Brennan

(57) ABSTRACT

A method includes forming a dummy gate over a substrate. A first gate spacer is formed on a sidewall of the dummy gate. The dummy gate is replaced with a gate structure. A top portion of the first spacer is removed. After the top portion of the first spacer is removed, a second spacer is over the first spacer. The second spacer has a stepped bottom surface with an upper step in contact with a top surface of the first spacer and a lower step lower than the top surface of the first spacer. A contact plug is formed contacting the gate structure and the second spacer.

20 Claims, 22 Drawing Sheets

(56) References Cited

U.S. PATENT DOCUMENTS

| | | | |
|---|---|---|---|
| 9,576,814 B2 | 2/2017 | Wu et al. | |
| 9,831,183 B2 | 11/2017 | Lin et al. | |
| 9,859,386 B2 | 1/2018 | Ho et al. | |
| 10,128,334 B1 | 11/2018 | Bourjot | |
| 10,388,770 B1 | 8/2019 | Xie | |
| 10,529,826 B1 | 1/2020 | Frougier | |
| 2014/0024192 A1* | 1/2014 | Kim | H01L 29/165 |
| | | | 438/296 |
| 2016/0308008 A1 | 10/2016 | Yeo | |
| 2016/0365426 A1 | 12/2016 | Ching | |
| 2018/0342420 A1* | 11/2018 | You | H01L 21/76843 |
| 2020/0020776 A1 | 1/2020 | Yang | |
| 2020/0098922 A1* | 3/2020 | You | H01L 29/41791 |
| 2020/0105577 A1* | 4/2020 | Liang | H01L 21/76843 |

\* cited by examiner

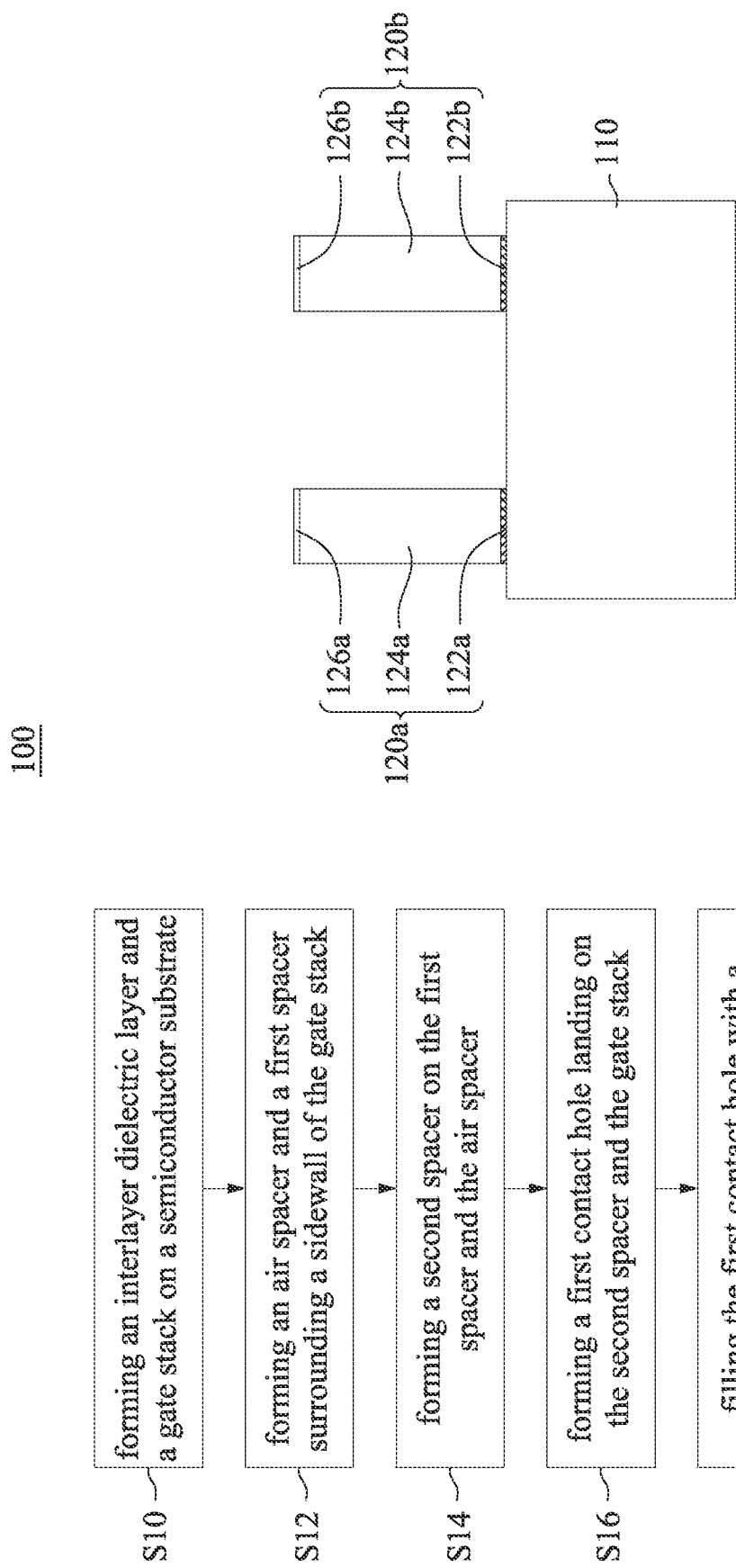

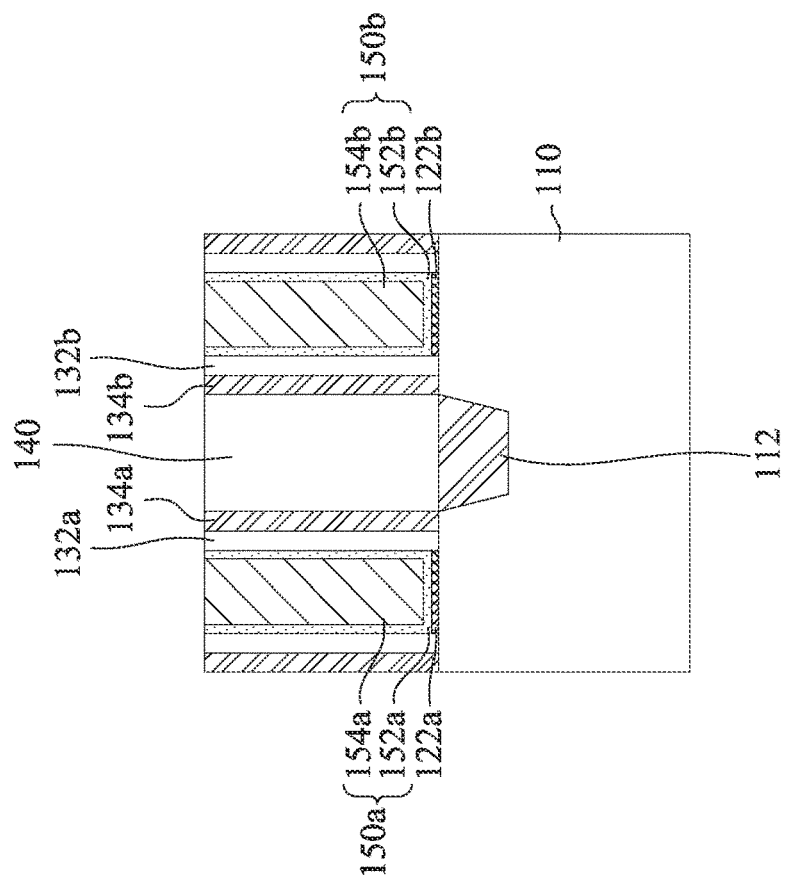
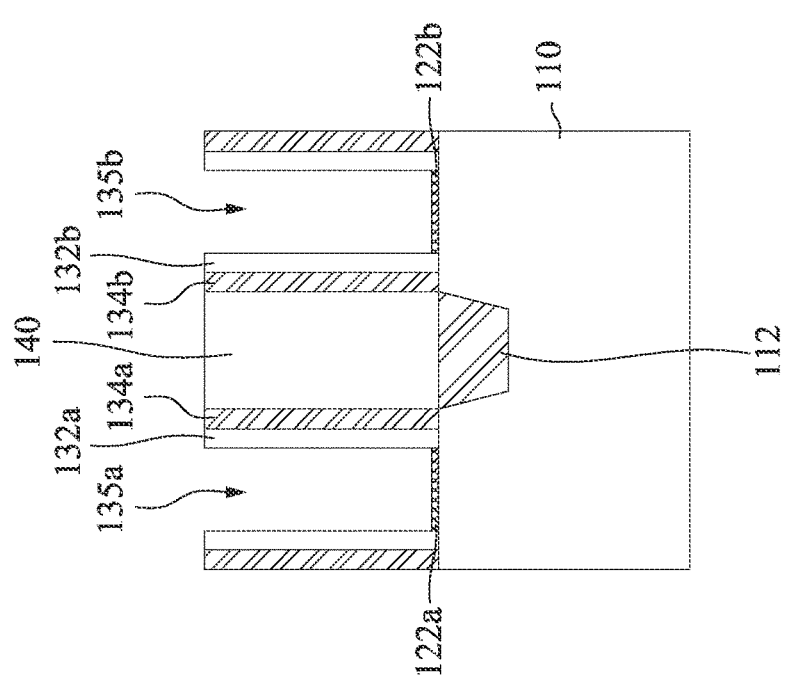

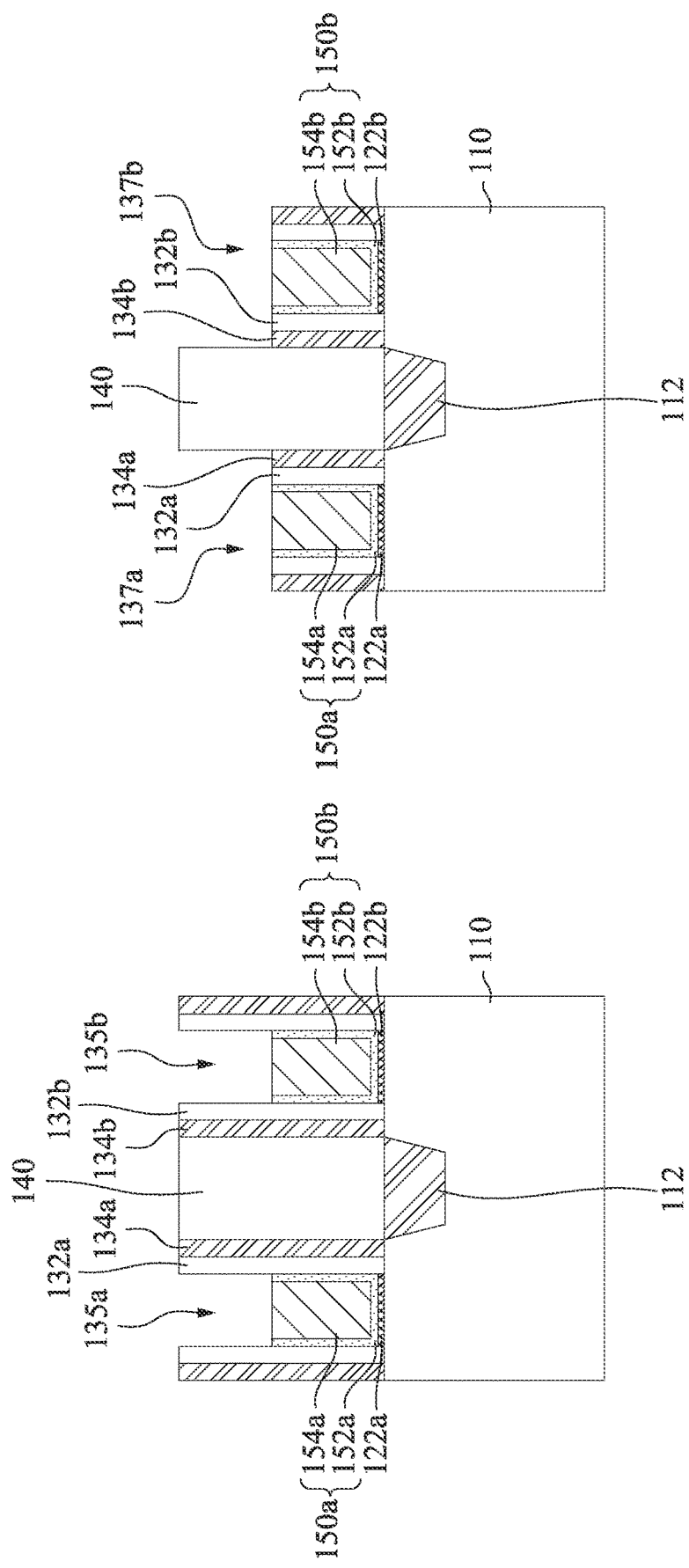

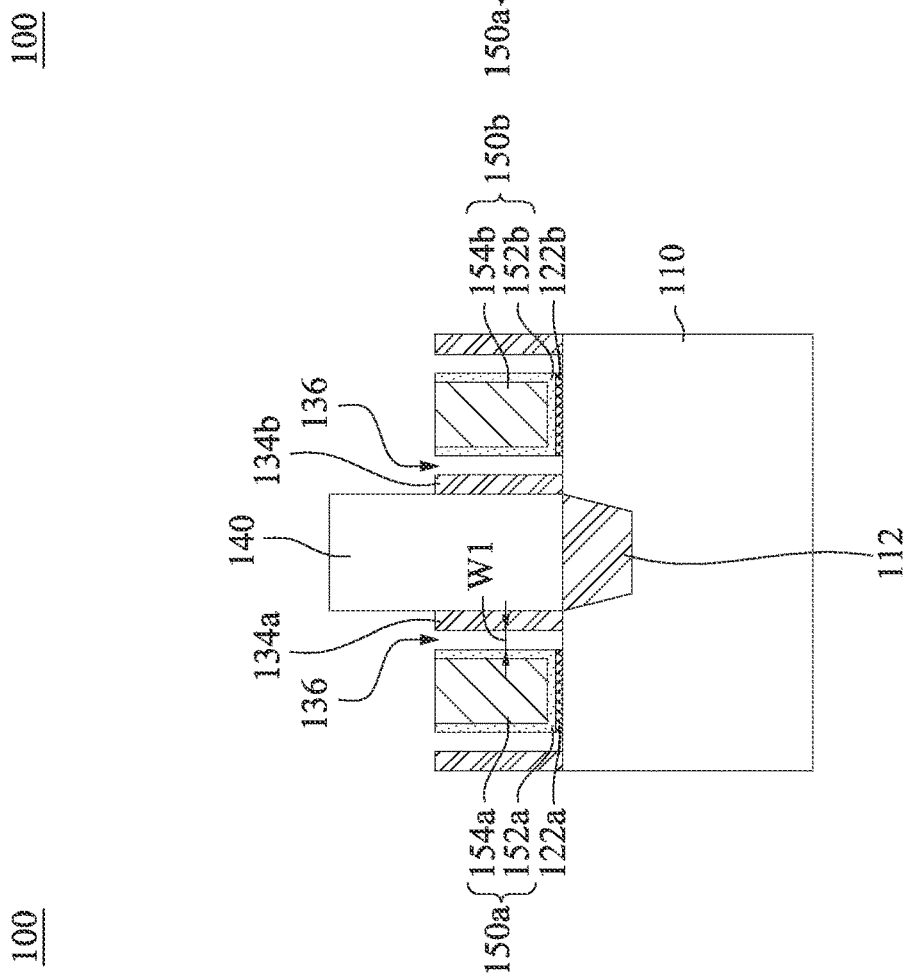
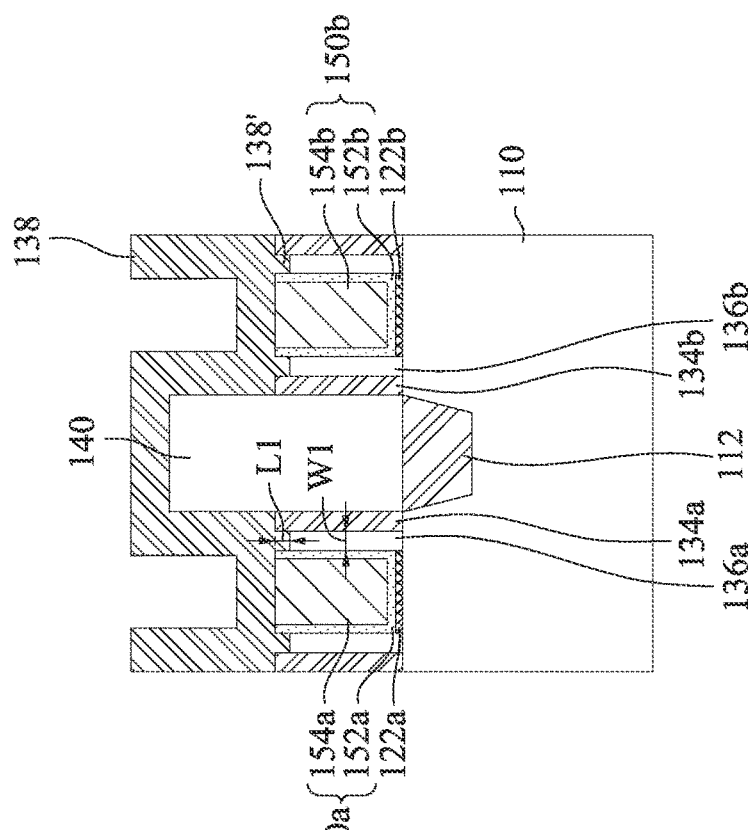

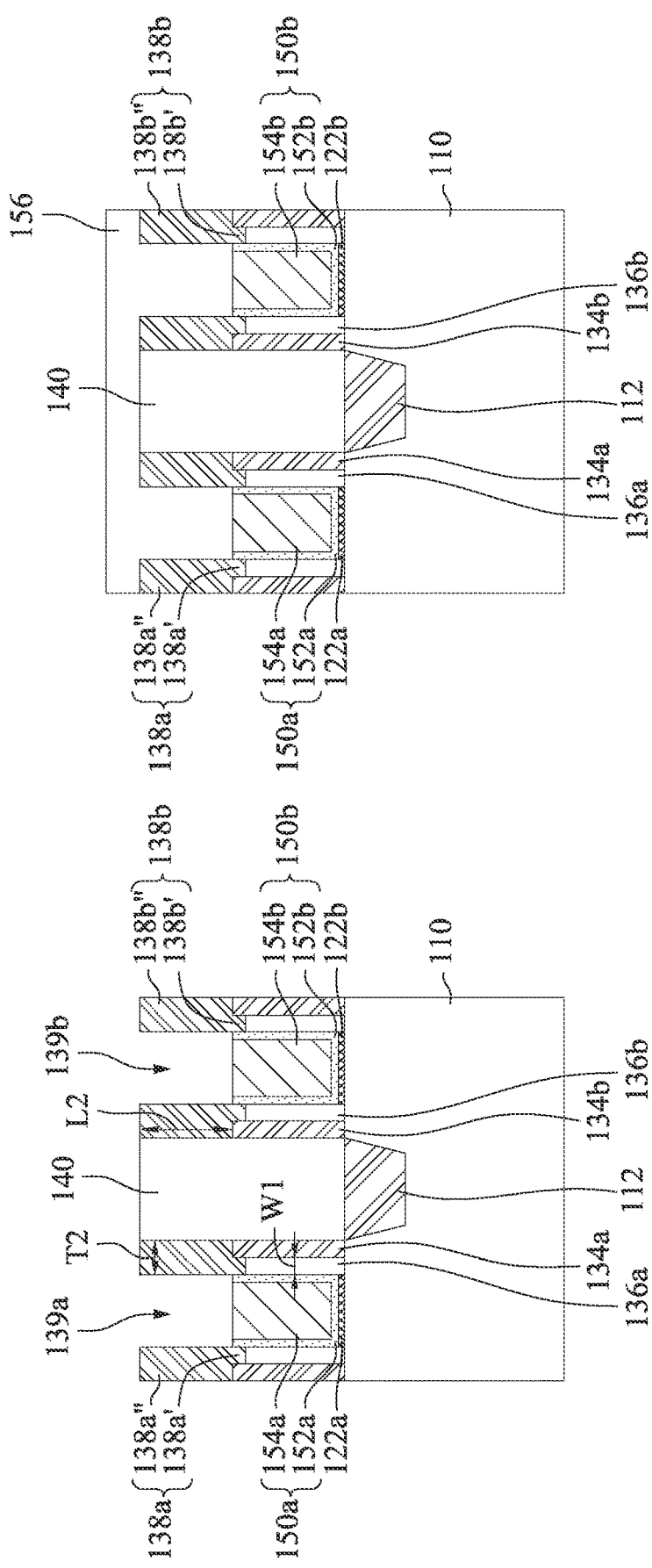

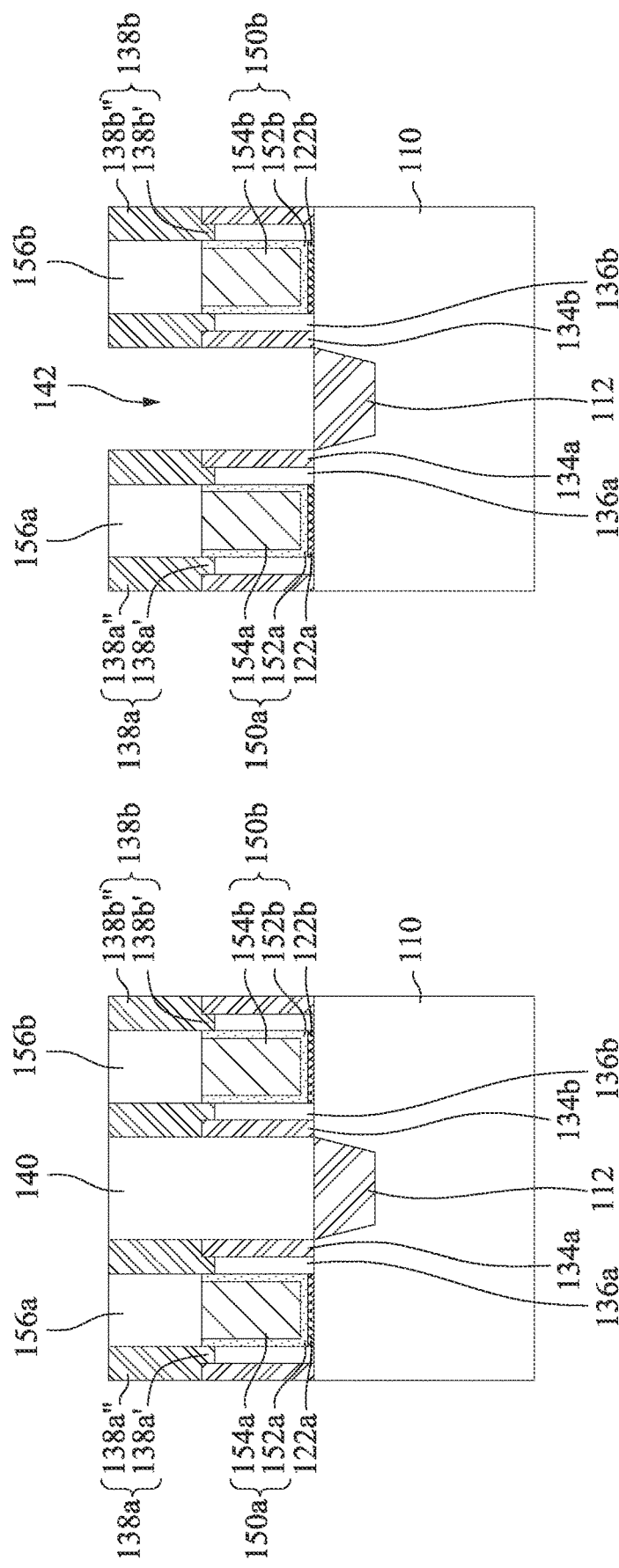

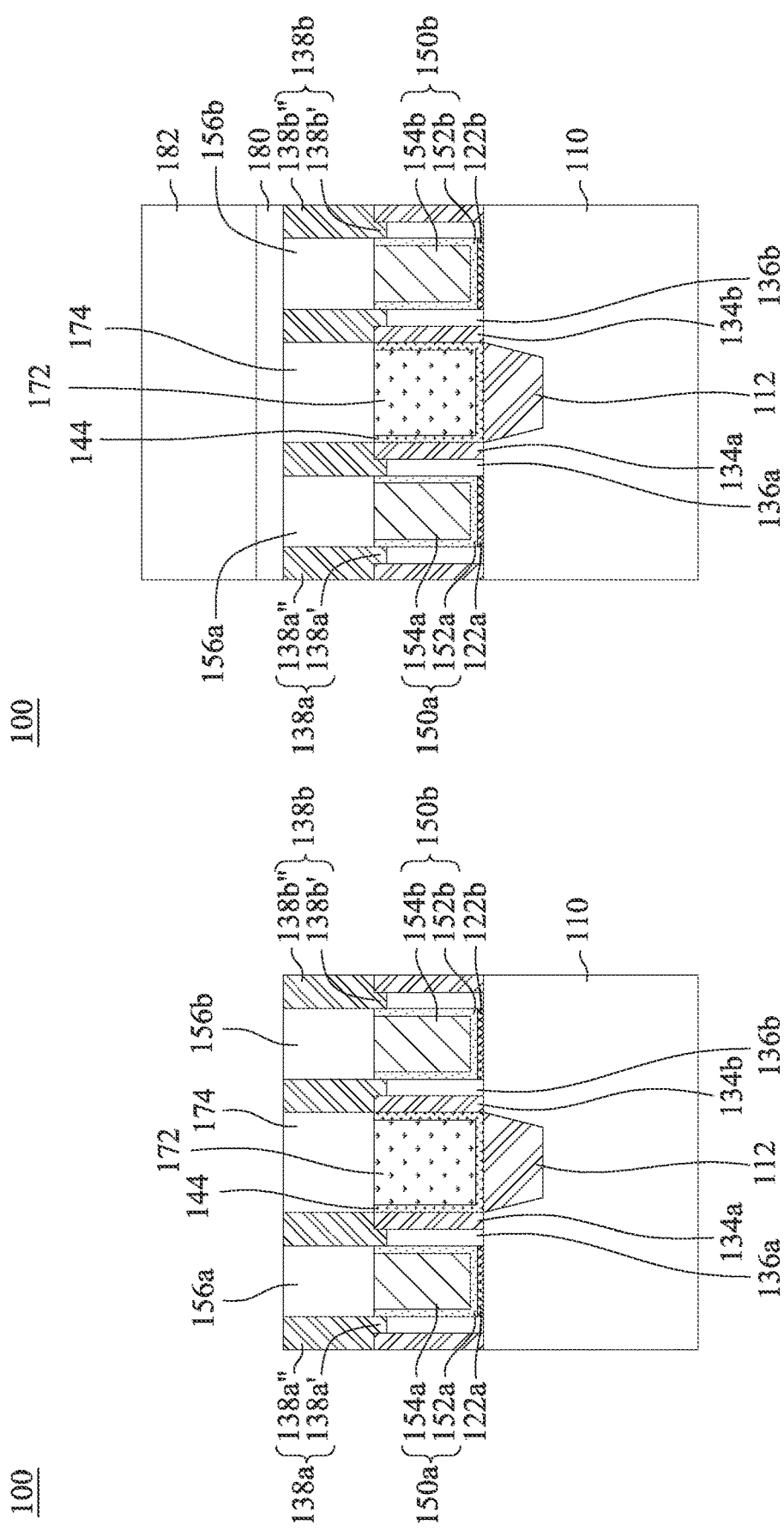

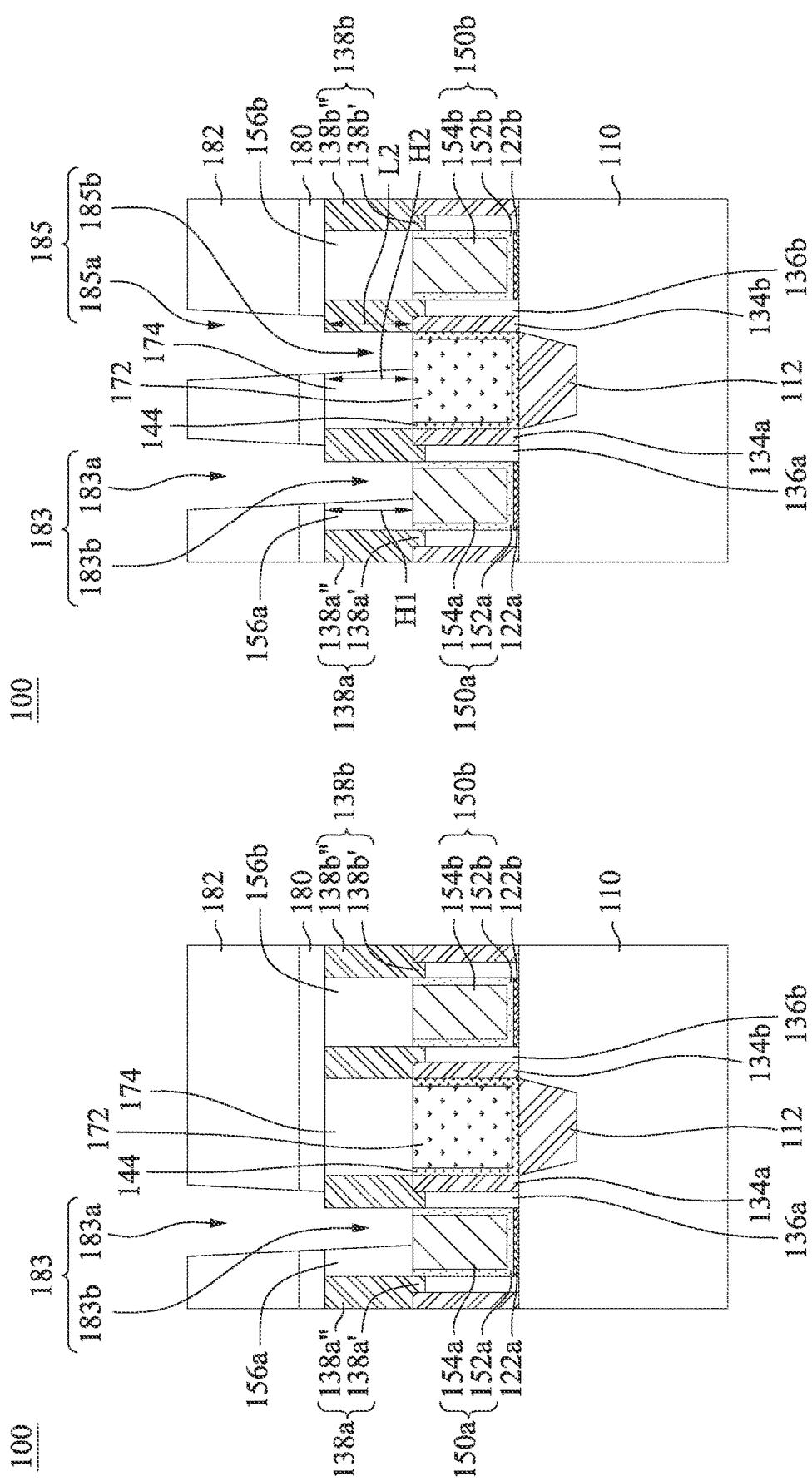

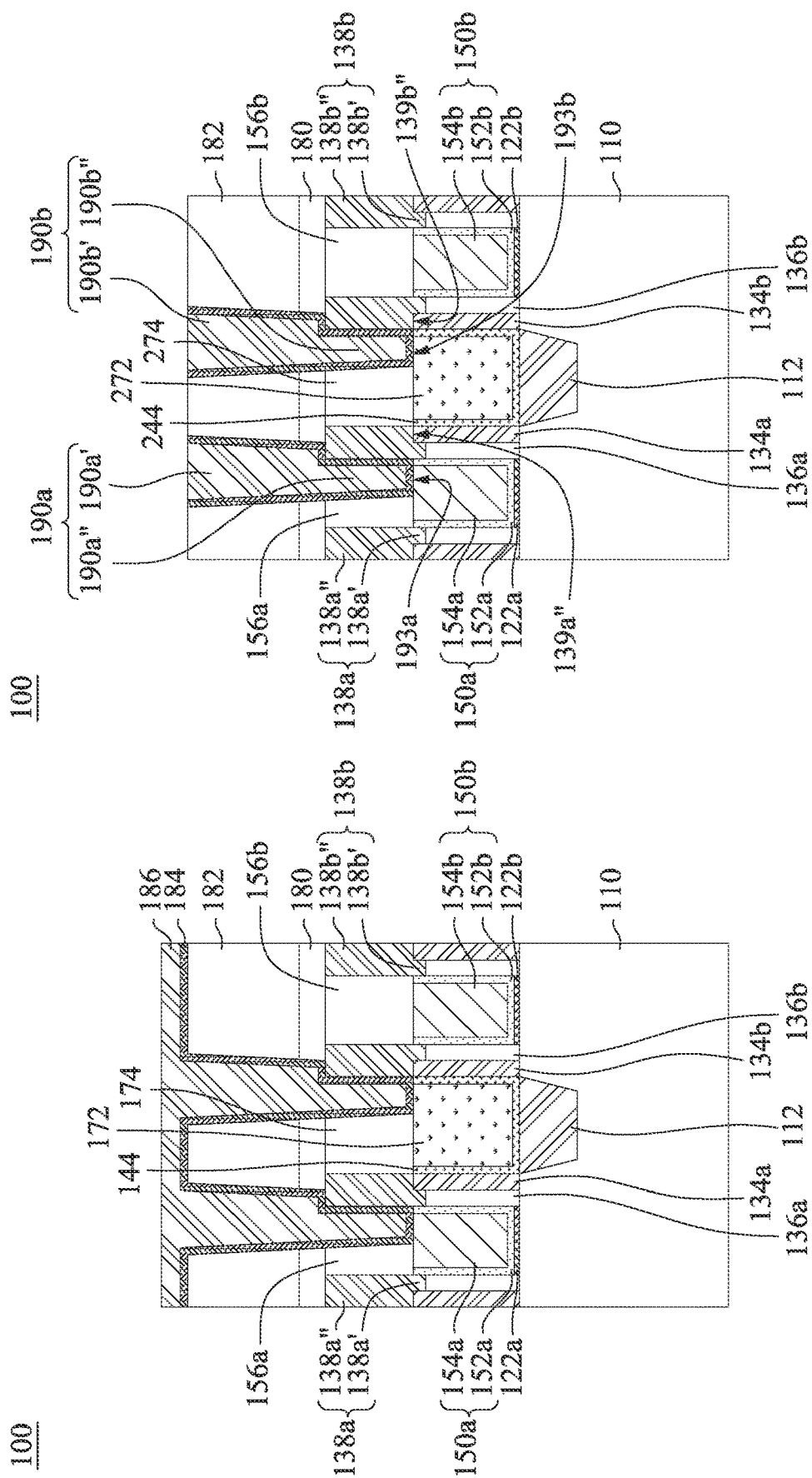

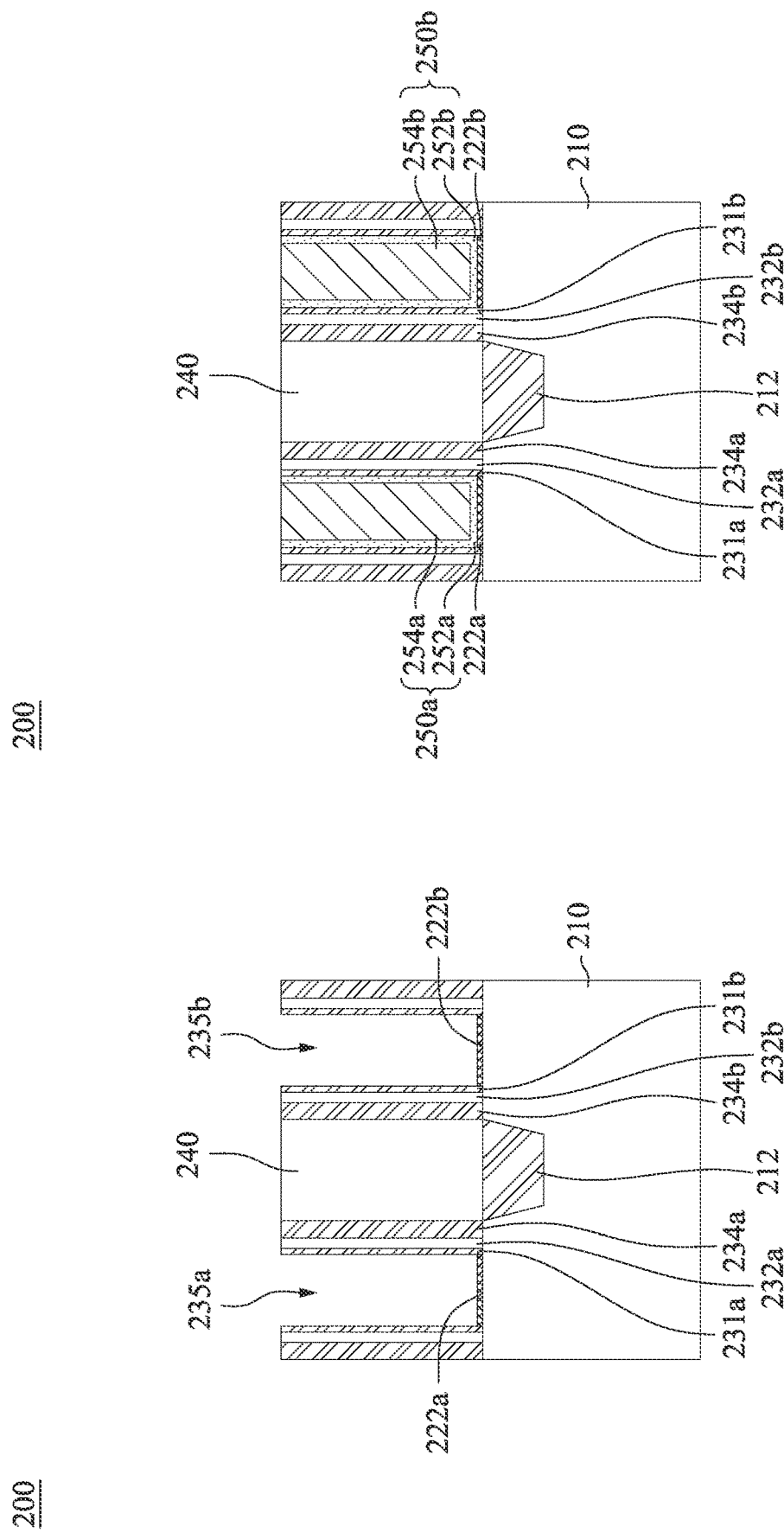

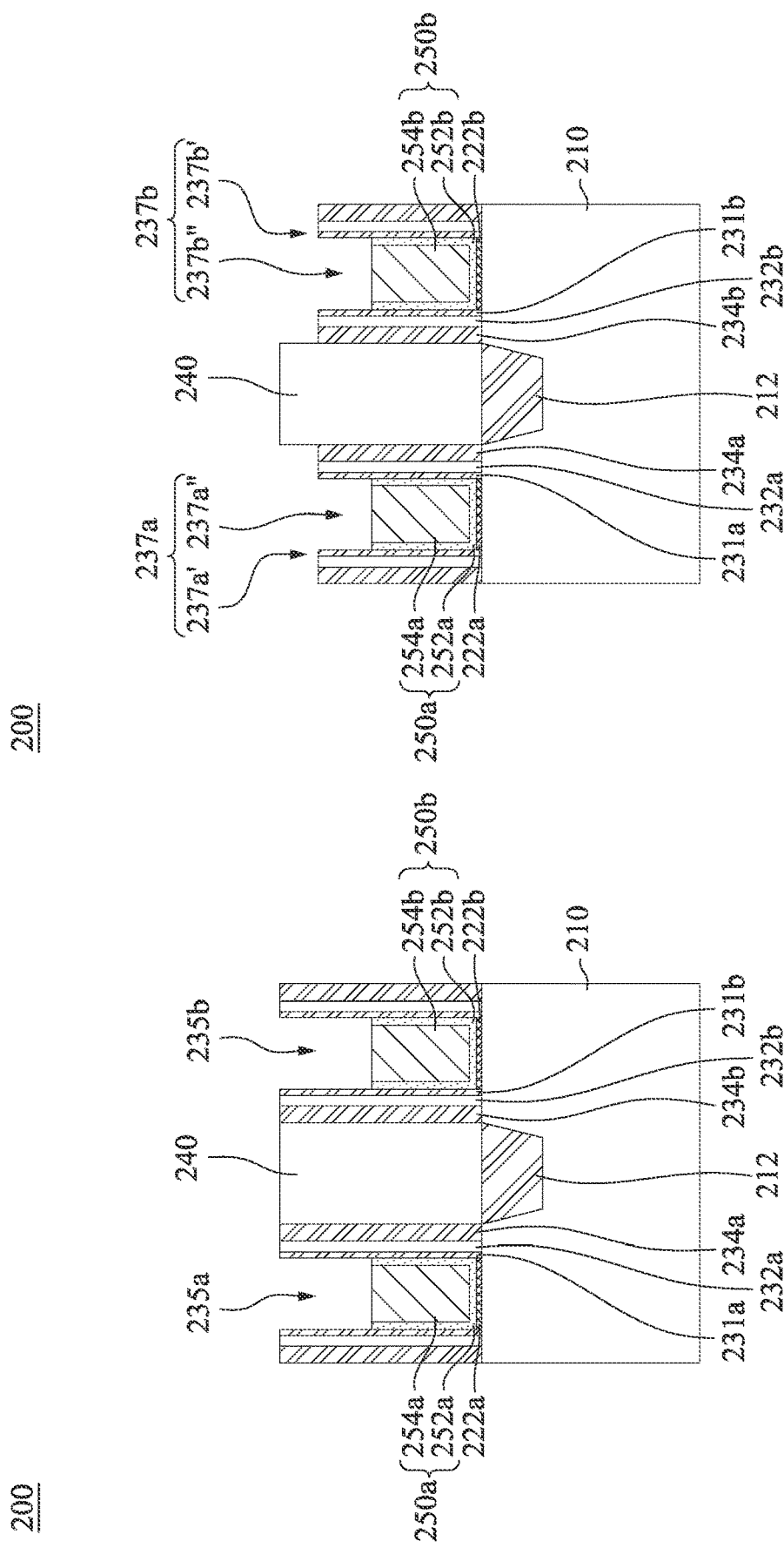

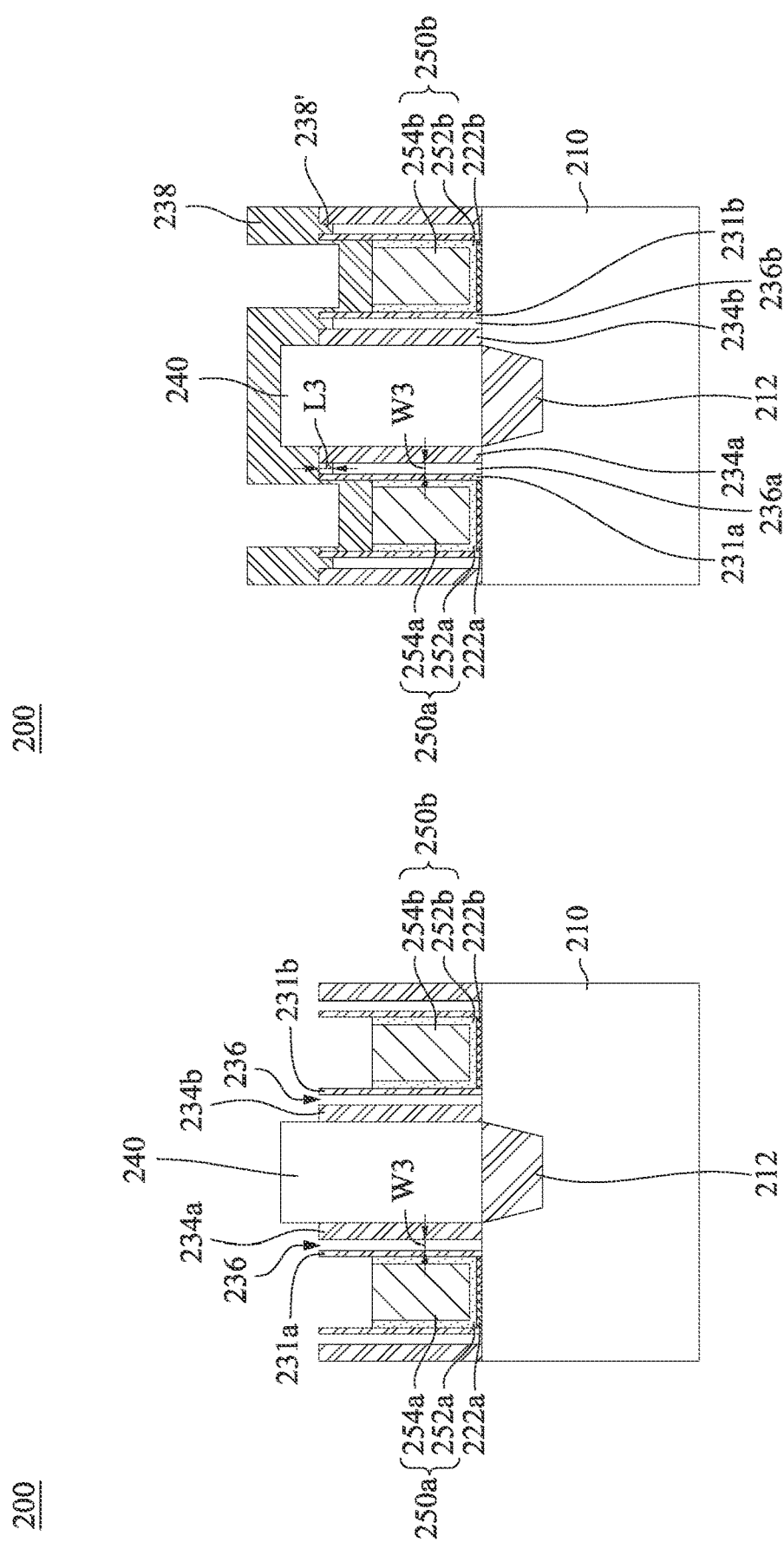

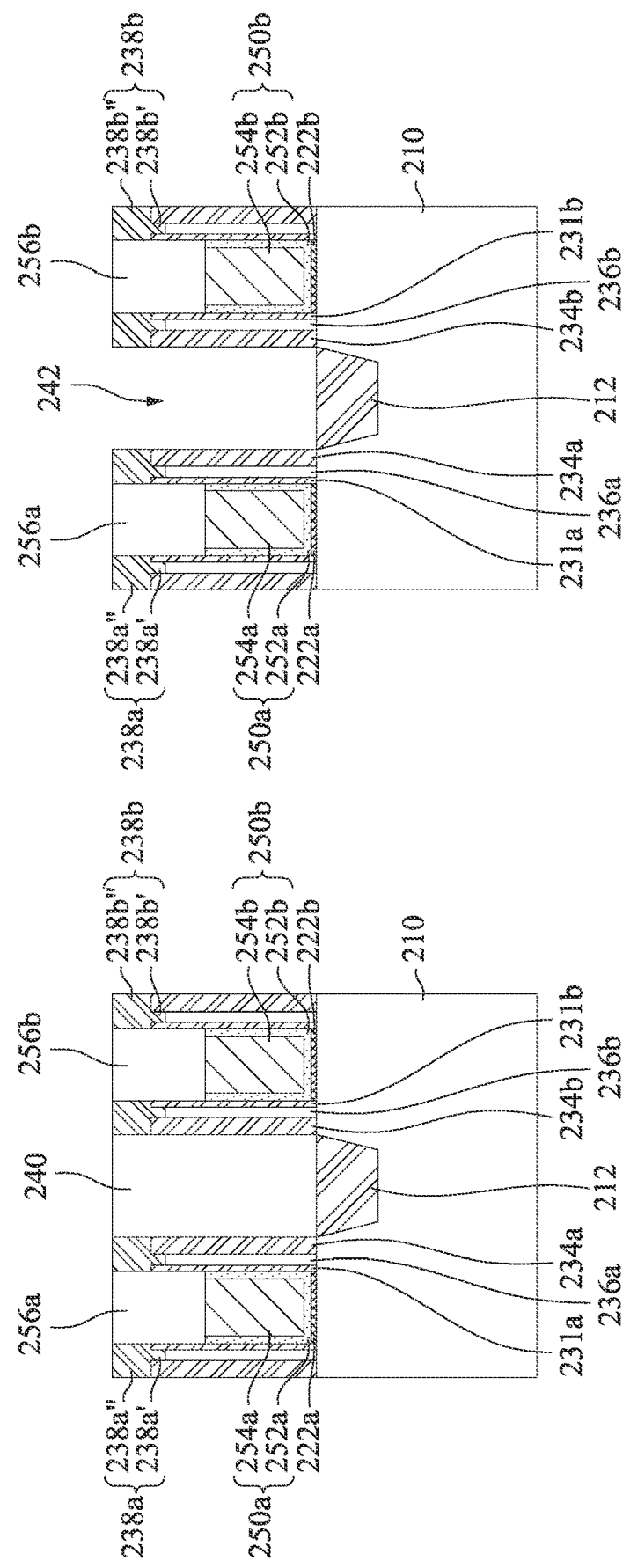

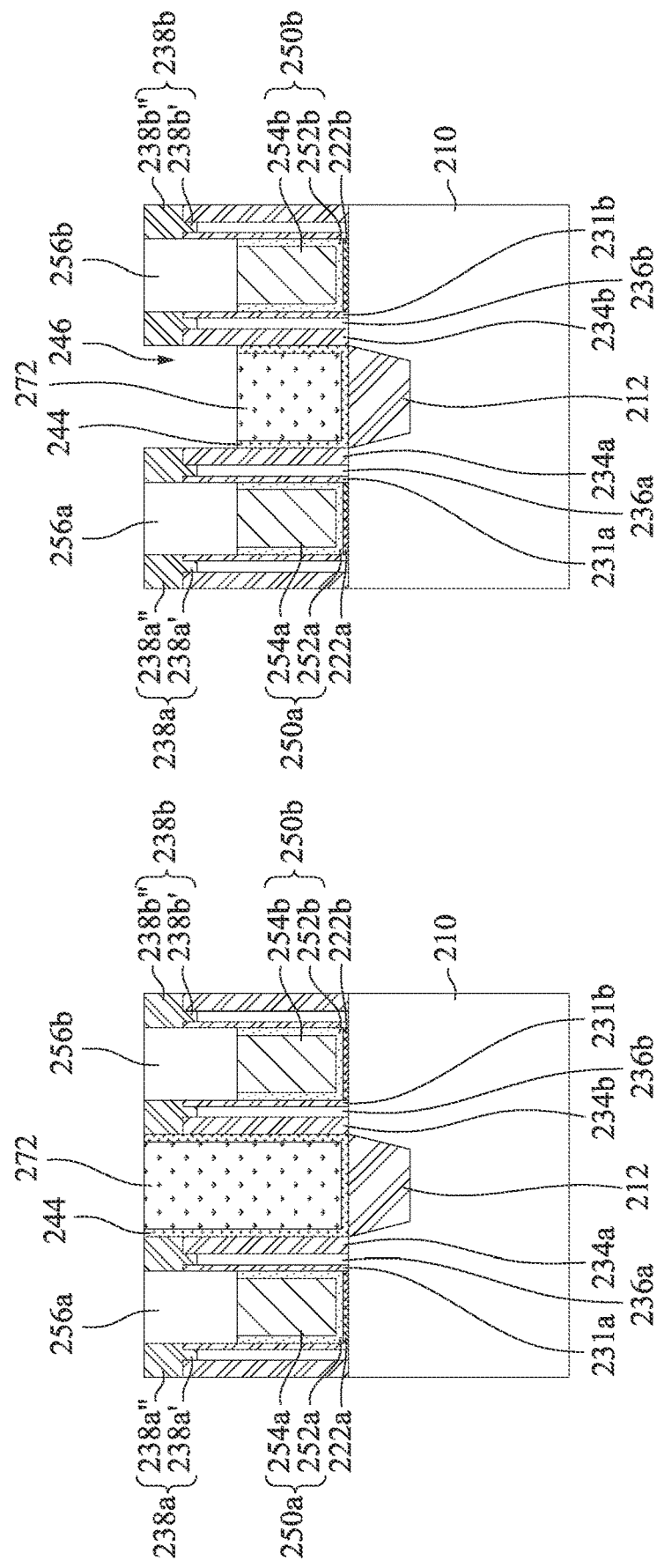

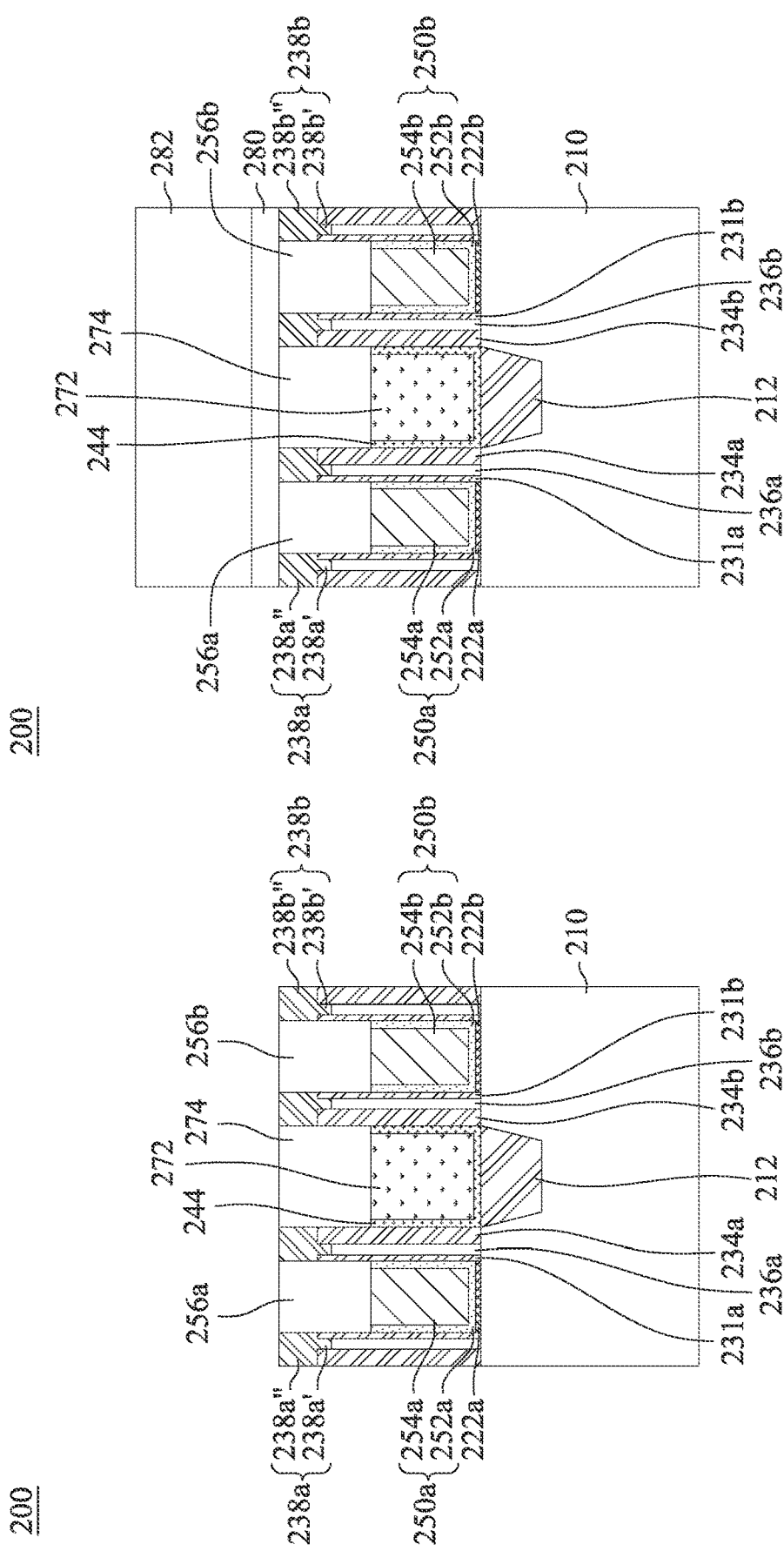

METHOD OF FABRICATING SEMICONDUCTOR DEVICE

PRIORITY CLAIM AND CROSS-REFERENCE

This application is a continuation application of the U.S. patent application Ser. No. 17/681,588, filed Feb. 25, 2022, now U.S. Pat. No. 11,631,749, issued Apr. 18, 2023, which is a divisional application of the U.S. patent application Ser. No. 16/690,092, filed Nov. 20, 2019, now U.S. Pat. No. 11,264,284, issued Mar. 1, 2022, which claims priority to U.S. Provisional Application Ser. No. 62/864,004, filed Jun. 20, 2019, which is herein incorporated by reference.

BACKGROUND

The semiconductor integrated circuit (IC) industry has experienced rapid growth. Technological advances in integrated circuit materials and design have produced generations of integrated circuits. Each generation has smaller and more complex circuits than the previous generation. However, these advances have increased the complexity of processing and manufacturing integrated circuits. In the course of integrated circuit evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart illustrating a method of fabricating a semiconductor device in accordance with some embodiments of the present disclosure;

FIGS. 2-22 are cross-sectional views illustrating a method for fabricating a semiconductor device at various stages in accordance with some embodiments of the present disclosure;

FIG. 23 is a flow chart illustrating a method of fabricating a semiconductor device in accordance with other embodiments of the present disclosure; and FIGS. 24-44 are cross-sectional views illustrating a method for fabricating a semiconductor device at various stages in accordance with other embodiments of the present disclosure.

DETAILED DESCRIPTION

Figure 3:
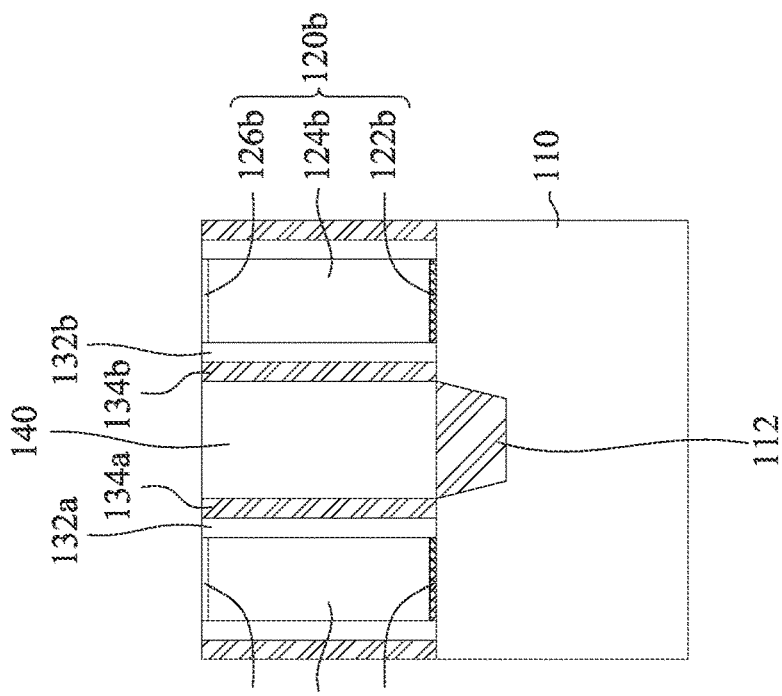

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 is a flow chart illustrating a method of fabricating a semiconductor device in accordance with some embodiments of the present disclosure. The method begins with block 10 in which an interlayer dielectric layer and a gate stack are formed on a semiconductor substrate. The method continues with block 12 in which an air spacer and a first spacer are formed to surround a sidewall of the gate stack, wherein the first spacer is on a sidewall of the interlayer dielectric layer, and the air spacer is between the gate stack and the first spacer. The method continues with block 14 in which a second spacer is formed on the first spacer and the air spacer, wherein the second spacer has a portion in contact with a sidewall of the first spacer. The method continues with block 16 in which a first contact hole is formed to land on the second spacer and the gate stack, wherein a sidewall of the first contact hole is defined by the second spacer. The method continues with block 18 in which the first contact hole is filled with a conductive material.

As employed in the present disclosure, the semiconductor device 100 refers to any fin-based, multi-gate transistor. The semiconductor device 100 may be included in a microprocessor, memory cell, and/or other integrated circuit (IC). It is understood that additional processes may be provided before, during, and after the method of FIG. 1, and that some other processes may only be briefly described herein. Also, FIGS. 1 through 22 are simplified for a better understanding of the inventive concepts of the present disclosure. For example, although the figures illustrate the semiconductor device 100, it is understood the IC may include a number of other devices including resistors, capacitors, inductors, fuses, etc.

Reference is made to FIGS. 2-22, which are cross-sectional views illustrating the method for fabricating the semiconductor device 100 at various stages in accordance with some embodiments of the present disclosure.

Reference is made to FIG. 2. A substrate with a fin structure 110 is provided. The fin structure 110 is formed by etching into the substrate. In some embodiments, the substrate may be a semiconductor wafer such as a silicon wafer. Alternatively or additionally, the substrate may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP.

Afterwards, dummy gate structures, such as a first dummy gate structure 120a and a second dummy gate structure 120b are formed cross over the fin structure 110. The first dummy gate structure 120a includes a gate dielectric layer 122a, a dummy gate electrode layer 124a, and a hard mask 126a. The second dummy gate structure 120b includes a gate dielectric layer 122b, a dummy gate electrode layer 124b, and a hard mask 126b. The formation of the gate dielectric layers 122a and 122b and the dummy gate electrode layers 124a and 124b includes depositing a gate dielectric material layer (not shown) over the fin structure 110, depositing a dummy gate material layer (not shown) over the gate dielectric material layer, and patterning the dummy gate material layer and the gate dielectric material layer by an etching process, in accordance with some embodiments. The gate dielectric material layer and the dummy gate material layer may be deposited using a chemical vapor deposition (CVD) process. The hard masks 126a and 126b are formed over portions of the dummy gate material layer during the etching process, such that portions of the gate dielectric material layer and the dummy gate material layer not covered by the hard masks 126a and 126b are removed. In some embodiments, the material of the gate dielectric layers 122a and 122b includes silicon oxide, and the material of the dummy gate electrode layer 124a and 124b includes polysilicon.

Reference is made to FIG. 3. Low-k spacers 132a and 132b are respectively formed on opposite sidewalls of the first and second dummy gate structures 120a and 120b. The low-k spacers 132a and 132b may be formed by conformally depositing a low-k spacer material layer (not shown) followed by an anisotropic etching (e.g., lateral etching) process. An example of a low-k spacer material may be a porous low-k material including SiOC, SiOCN, other suitable materials, or combinations thereof. After the low-k spacers 132a and 132b are formed, the first spacers 134a and 134b are then respectively formed adjacent to the low-k spacers 132a and 132b. The first spacers 134a and 134b may be formed by conformally depositing a first spacer material layer (not shown) followed by an anisotropic etching (e.g., lateral etching) process. An example of the first spacer material layer may be a non-porous material including nitride. As a result, the low-k spacers 132a and 132b are formed between the first and second dummy gate structures 120a and 120b and the first spacers 134a and 134b.

After the formation of the low-k spacers 132a and 132b and the first spacers 134a and 134b, a source/drain region 112 is formed in the substrate between the first and second dummy gate structures 120a and 120b. Although only one source/drain region 112 is illustrated in FIG. 3, a plurality of source/drain regions may be formed on opposite sides of the first and second dummy gate structures 120a and 120b. A dimension of the source/drain region 112 is defined by the first spacers 134a and 134b. In some embodiments, the source/drain region 112 may include the introduction of suitable dopant types, such as n-type or p-type dopants. The formation of the source/drain region 112 includes halo (or pocket) and/or low-dose drain (LDD) implantation, source/drain implantation, source/drain activation and/or other suitable processes. In other embodiments, the source/drain regions may include raised source/drain regions, strained regions, epitaxially grown regions, and/or other suitable techniques. In further embodiments, the source/drain activation process may include a rapid thermal annealing.

Figure 4:
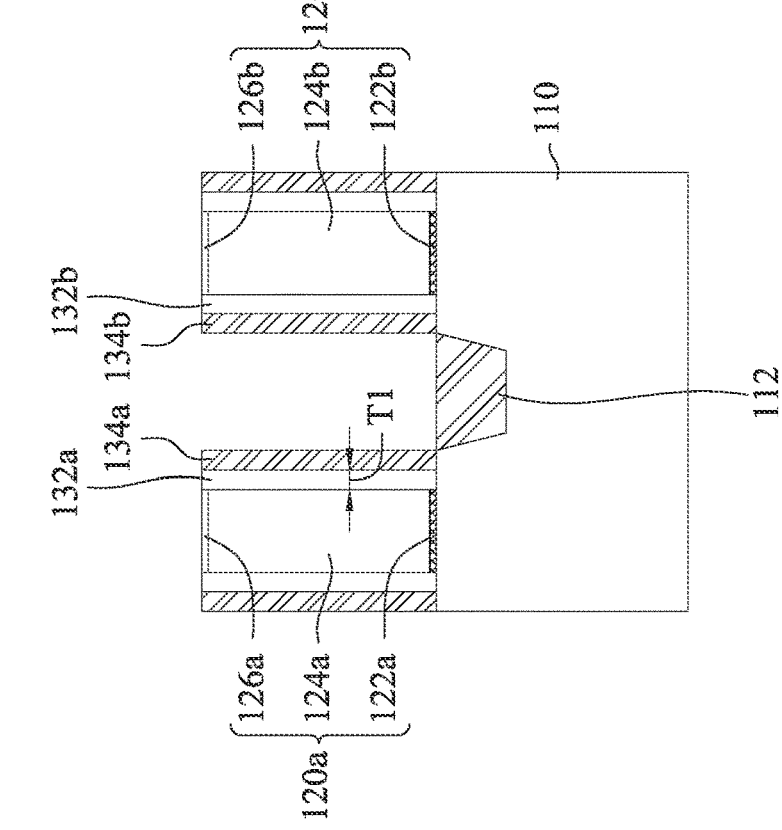

Reference is made to FIG. 4. A first interlayer dielectric (ILD) layer 140 is formed between the first and second dummy gate structures 120a and 120b, such that the first spacers 134a and 134b are on sidewalls of the ILD layer 140. The first ILD layer 140 may be formed by a CVD process, a high-density plasma (HDP) process, the like, or combinations thereof. In some embodiments, the first ILD layer 140 may be optionally planarized to lower its top surface to a level of first and second dummy gate structures 120a and 120b. For example, the first ILD layer 140 is planarized by using a chemical mechanical planarization (CMP) process. In other embodiments, other planarization techniques may be used, such as etching. The material of the first ILD layer 140 may include a dielectric material, such as a non-porous oxide material.

Reference is made to FIG. 5. The hard masks 126a and 126b (see FIG. 4) are removed after the first ILD layer 140 is formed. The dummy gate electrode layer 124a and 124b (see FIG. 4) are then removed to respectively form recesses 135a and 135b between the low-k spacers 132a and 132b. The removal of the dummy gate electrode layer 124a and 124b may be performed by a dry etching process which is selective to the material of the dummy gate electrode layer 124a and 124b. For example, if the dummy gate electrode layer 124a and 124b includes polysilicon, a dry etch using NF, SF, Cl, HBr, the like, or combinations thereof; or a wet etch using $NH_4OH$, tetramethylammonium hydroxide (TMAH), the like, or combinations thereof may be performed. In some embodiments, the etching of the dummy gate electrode layer 124a and 124b may stop at the gate dielectric layers 122a and 122b. As a result, the recesses 135a and 135b are formed to respectively expose the gate dielectric layers 122a and 122b. In alternative embodiments, the gate dielectric layers 122a and 122b may be removed along with the dummy gate electrode layer 124a and 124b. Diameters of the recesses 135a and 135b are respectively defined by sidewalls of the low-k spacers 132a and 132b.

Reference is made to FIG. 6. Gate stacks 150a and 150b are respectively formed in the recesses 135a and 135b (see FIG. 5). In some embodiments, the gate stacks 150a and 150b may include a single material or any combination of layers and different materials as may be appropriate. For example, the gate stacks 150a and 150b may include work function layers 152a and 152b and metal gate electrode layers 154a and 154b. The work function layers 152a and 152b and the metal gate electrode layers 154a and 154b are sequentially formed in the recesses 135a and 135b. For example, a work function material layer (not shown) is conformally formed in the recesses 135a and 135b covering the gate dielectric layers 122a and 122b and sidewalls of the low-k spacers 132a and 132b, and a metal gate electrode material layer (not shown) is then deposited, such as by a CVD process, a physical vapor deposition (PVD) process, the like, or a combination thereof, to fill in the recesses 135a and 135b. A planarization process, such as a CMP process, may be performed to remove excess portions of the metal gate electrode material layer and the work function material layer, in which the excess portions are over the top of the first ILD layer 140, the low-k spacers 132a and 132b, and the first spacers 134a and 134b, thus resulting in a replacement of the dummy gate electrode layer 124a and 124b (see FIG. 4) and the hard masks 126a and 126b (see FIG. 4) with the gate stacks 150a and 150b including the work function layers 152a and 152b and the metal gate electrode layers 154a and 154b. The work function layers 152a and 152b may be tuned to have a proper work function. For example, if a p-type work function metal (p-metal) for a p-metal oxide semiconductor (pMOS) device is desired, p-type work function materials may be used. On the other hand, if an n-type work function metal (n-metal) for n-metal oxide semiconductor (nMOS) devices is desired, n-type work function materials may be used. The materials of the metal gate electrode layers 154a and 154b may include elemental metal, an alloy of metals, multiple layers of elemental metal, or combinations thereof, and can include tungsten (W), aluminium (Al), cobalt (Co), ruthenium (Ru), the like, or combinations thereof.

Reference is made to FIG. 7. The gate stacks 150a and 150b are etched back to a level approximately half the height of the low-k spacers 132a and 132b and the first spacers 134a and 134b. A mask layer (not shown) may be formed over the first ILD layer 140, the low-k spacers 132a and 132b, and the first spacers 134a and 134b during the etching process. As a result, the recesses 135a and 135b are reappeared with a shallower depth, and upper portions of the low-k spacers 132a and 132b are exposed by the work function layers 152a and 152b of the gate stacks 150a and 150b.

Reference is made to FIG. 8. The upper portions of the low-k spacers 132a and 132b and upper portions of the first spacers 134a and 134b are removed by an anisotropic etching (e.g., lateral etching) process. In some embodiments, the low-k spacers 132a and 132b and the first spacers 134a and 134b are etched back to a level approximately the height of the gate stacks 150a and 150b. A mask layer (not shown) may be formed over the first ILD layer 140 during the etching process. Furthermore, since the anisotropic etching process has a milder impact to the underlying gate stacks 150a and 150b, the gate stacks 150a and 150b are retained. As a result, recesses 137a and 137b are formed between the adjacent first ILD layers 140. Stated differently, diameters of the recesses 137a and 137b are defined by sidewalls of the adjacent first ILD layers 140, such that the diameters of the recesses 137a and 137b are larger than the diameters of the recesses 135a and 135b (see FIG. 7) which are defined by sidewalls of the low-k spacers 132a and 132b.

Reference is made to FIG. 9. The remaining low-k spacers 132a and 132b are then removed, such that spaces 136 are formed between the gate stacks 150a and 150b and the first spacers 134a and 134b, and portions of the fin structure 110 are exposed from the spaces 136. The removal of the low-k spacers 132a and 132b may be performed by an etching process, such as a wet etching process or a dry etching process. In some embodiments, the material of the low-k spacers 132a and 132b, such as SiOC or SiOCN, gives an etching selectivity relative to the material of the first ILD layer 140 and the first spacers 134a and 134b including oxide and nitride, respectively. In alternative embodiments, the porous material of the low-k spacers 132a and 132b gives an etching selectivity relative to the non-porous materials of the first ILD layer 140 and the first spacers 134a and 134b. As a result, sidewalls of the first spacers 134a and 134b, sidewalls of the gate stacks 150a and 150b, and sidewalls of the gate dielectric layers 122a and 122b are exposed from the spaces 136.

Reference is made to FIG. 10. A second spacer material 138 is conformally formed on the semiconductor structure 100 shown in FIG. 9 by deposition. For example, the second spacer material 138 covers the first ILD layer 140, the gate stacks 150a and 150b, the first spacers 132a and 132b, and the spaces 136 (see FIG. 9), and is formed on sidewalls of the first ILD layer 140. In some embodiments, the second spacer material 138 has portions 138' embedded into the spaces 136 and in contact with sidewalls of the gate stacks 150a and 150b and sidewalls of the first spacers 134a and 134b. Hence, spaces 136 are reappeared with a smaller height and are referred to as air spacers 136a and 136b in the following descriptions. The air spacers 136a and 136b having an extremely low-k characteristic are formed to reduce parasitic capacitance of the semiconductor device 100. Since portions 138' of the second spacer material 138 extend into the spaces 136 during the deposition, a height of the air spacers 136a and 136b is smaller than that of the first spacers 134a and 134b and that of the gate stacks 150a and 150b, and top surfaces of the air spacers 136a and 136b are lower than that of the gate stacks 150a and 150b. Examples of the second spacer material 138 include, but are not limited to, high-k dielectric materials including AlO, AlN, AlON, ZrO, ZrN, ZrAlO, HfO, the like, or combinations thereof; or non-porous and low-k materials including SiO, SiN, SiC, SiCN, SiON, SiOCN, the like, or combinations thereof.

Since a thickness T1 of the removed low-k spacers 132a and 132b (see FIG. 3) is in a range from about 1 nm to about 10 nm, a width W1 of the spaces 136 (see FIG. 9) is in a range from about 1 nm to about 10 nm, and a width W1 of the air spacers 136a and 136b is in a range from about 1 nm to about 10 nm. In some embodiments, a length L1 of the portions 138' of the second spacer material 138 extending into the spaces 136 is controlled by the width W1 of the spaces 136 which is in a range from about 1 nm to about 10 nm. For example, if the width W1 of the spaces 136 is larger than about 10 nm, the second spacer material 138 may easily fill in the spaces 136 at a large extent during the deposition, resulting in a decrease in height of the air spacers 136a and 136b, or even an entire filling-up of the spaces 136. On the other hand, if the width W1 of the spaces 136 is smaller than about 1 nm, which means the thickness T1 of the removed low-k spacer 132a and 132b is smaller than about 1 nm, the formation of the spaces 136 may be difficult since bottom portions of the low-k spacers 132a and 132b may be difficult to remove due to the small thickness T1. In some embodiments, the length L1 of the portions 138' of the second spacer material 138 extending into the spaces 136 is in a range from about 0.5 nm to about 5 nm to ensure that the height of the air spacers 136a and 136b is in an appropriate range to maintain their functionality (i.e., to reduce parasitic capacitance of the semiconductor device 100).

Reference is made to FIG. 11. An anisotropic etching (e.g., lateral etching) process is performed such that portions of the second spacer material 138 (see FIG. 10) are removed. For example, portions of the second spacer material 138 covering the gate stacks 150a and 150b are removed, and portions of the second spacer material 138 above the top surface of the first ILD layer 140 are also removed. As a result, second spacers 138a and 138b are formed standing on the first spacers 132a and 132b and the air spacers 136a and 136b, and recesses 139a and 139b are respectively formed between the second spacers 138a and 138b, that is, diameters of the recesses 139a and 139b are respectively defined by sidewalls of the second spacers 138a and 138b. The gate stacks 150a and 150b are exposed by the second spacers 138a and 138b, and top surfaces of the second spacers 138a and 138b are coplanar with the top surface of the first ILD layer 140. In some embodiments, a thickness T2 of the second spacers 138a and 138b is in a range from about 1 nm to about 10 nm. Furthermore, the thickness T2 of the second spacers 138a and 138b should be larger than the width W1 of air spacers 136a and 136b to ensure the air spacers 136a and 136b being entirely sealed. If the thickness T2 of the second spacers 138a and 138b is smaller than about 1 nm, the air spacers 136a and 136b may possibly be exposed, resulting in a fragile structure of the semiconductor device 100; if the thickness T2 of the second spacers 138a and 138b is larger than about 10 nm, the size of the semiconductor device 100 would be increased accordingly.

After this step, the second spacers 138a and 138b including first portions 138a' and 138b' and second portions 138a" and 138b" are formed. The first portions 138a' and 138b' are the portions 138' of the second spacer material 138 extending into the spaces 136 (see FIG. 8) and are in contact with sidewalls of the first spacers 134a and 134b and sidewalls of the gate stacks 150a and 150b. The second portions 138a" and 138b" are on the first portions 138a' and 138b' of the second spacers 138a and 138b and the first spacers 134a and 134b.

Reference is made to FIG. 12. A first sacrificial material layer 156 is deposited over the semiconductor structure 100 shown in FIG. 11 by, for example, a CVD process, a plasma enhanced chemical vapor deposition (PECVD) process, the like, or combinations thereof. For example, the first sacrificial material layer 156 is filled in the recesses 139a and 139b (see FIG. 11), and formed over the second spacers 138a and 138b and the first ILD layer 140. The material of the first sacrificial material layer 156 may include a porous and low-k material. Examples of the porous and low-k material are, but are not limited to, SiO, SiN, SiC, SiCN, SiON, SiOCN, the like, or combinations thereof. Such a material give an etching selectivity relative to the materials of the second spacers 138a and 138b (i.e., the second spacer material 138), which include, but are not limited to, high-k dielectric materials including AlO, AlN, AlON, ZrO, ZrN, ZrAlO, HfO, the like, or combinations thereof; or non-porous and low-k materials including SiO, SiN, SiC, SiCN, SiON, SiOCN, the like, or combinations thereof.

Reference is made to FIG. 13. A planarization process is performed to lower the first sacrificial material layer 156 and to expose the second spacers 138a and 138b. In some embodiments, the first sacrificial material layer 156 is planarized by using a CMP process. In other embodiments, other planarization techniques may be used, such as etching. As a result, first sacrificial layers 156a and 156b are respectively formed in the recesses 139a and 139b (see FIG. 11) and are respectively formed between the second spacers 138a and 138b. Additionally, top surfaces of the first sacrificial layers 156a and 156b are coplanar with top surfaces of the second spacers 138a and 138b and the top surface of the first ILD layer 140.

Reference is made to FIG. 14. The first ILD layer 140 is removed by an etching process. A mask layer (not shown) may be formed over the first sacrificial layer 156a and 156b and the second spacers 138a and 138b during the etching process. The removal of the first ILD layer 140 results in a formation of a recess 142 above the underlying source/drain region 112, that is, an exposure of the underlying source/drain region 112 from the recess 142.

Figure 15:
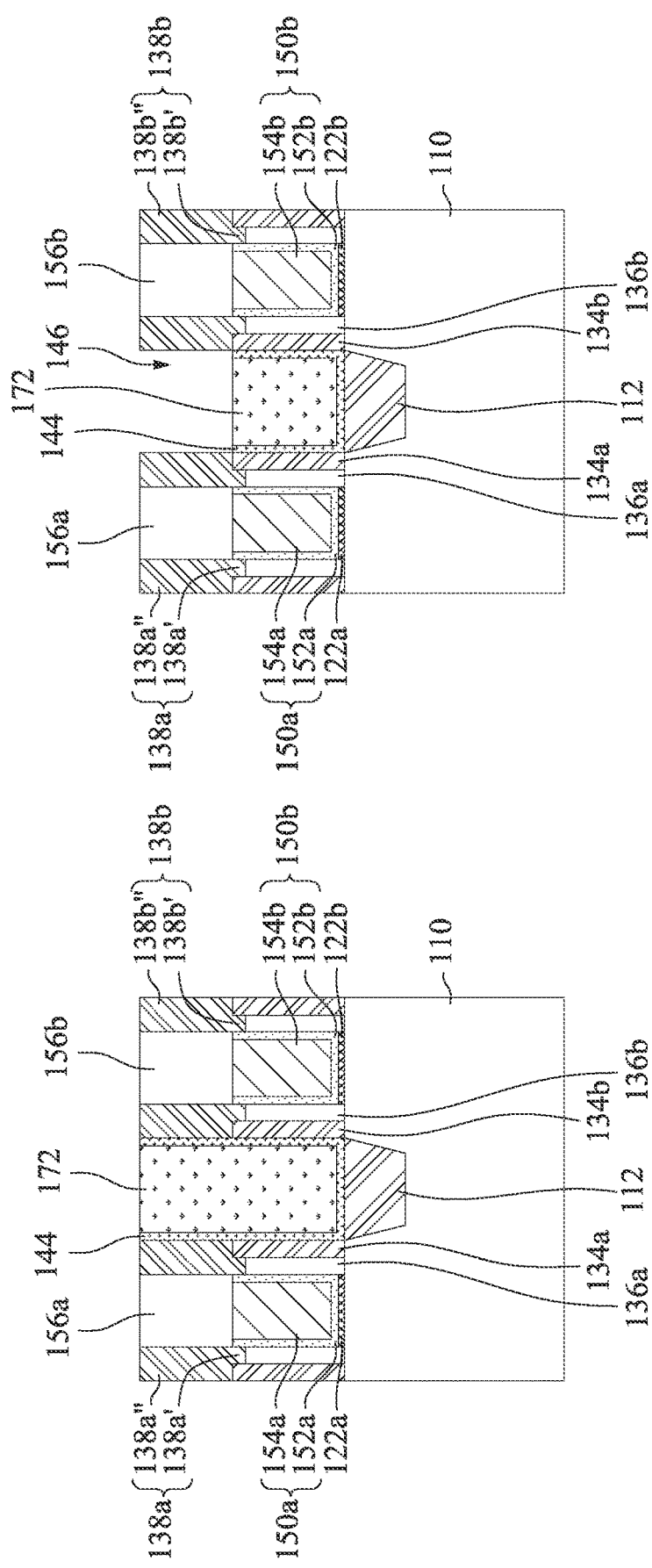

Reference is made to FIG. 15. A first barrier layer 144 and a bottom conductive feature 172 are sequentially formed in the recess 142 (see FIG. 14). In some embodiments, a first barrier material layer (not shown) is conformally formed in the recess 142 covering the source/drain region 112, sidewalls of the first spacers 134a and 134b, and sidewalls of the second spacers 138a and 138b, and a bottom conductive material (not shown) is then deposited, such as by a CVD process, a PVD process, a PECVD process, a low pressure CVD (LPCVD) process, the like, or a combination thereof, to fill in the recess 142. A planarization process, such as a CMP process, may be performed to remove excess portions of the first barrier material layer and the bottom conductive material, and thus resulting in a replacement of the first ILD layer 140 with the first barrier layer 144 and the bottom conductive feature 172. In some embodiments, the first barrier material layer includes, but are not limited to, cobalt (Co), silver (Ag), aluminium (Al), zinc (Zn), calcium (Ca), gold (Au), magnesium (Mg), tungsten (W), molybdenum (Mo), nickel (Ni), chromium (Cr), the like, or combinations thereof. Additionally, the bottom conductive material includes conductive materials, such as tungsten (W), aluminium (Al), cobalt (Co), ruthenium (Ru), the like, or combinations thereof, which form an electrical connection to the source/drain region 112. In some embodiments, other layers such as a work function layer and/or a capping layer may be formed in the recess 142, but the present disclosure is not limited in this regard.

Figure 16:
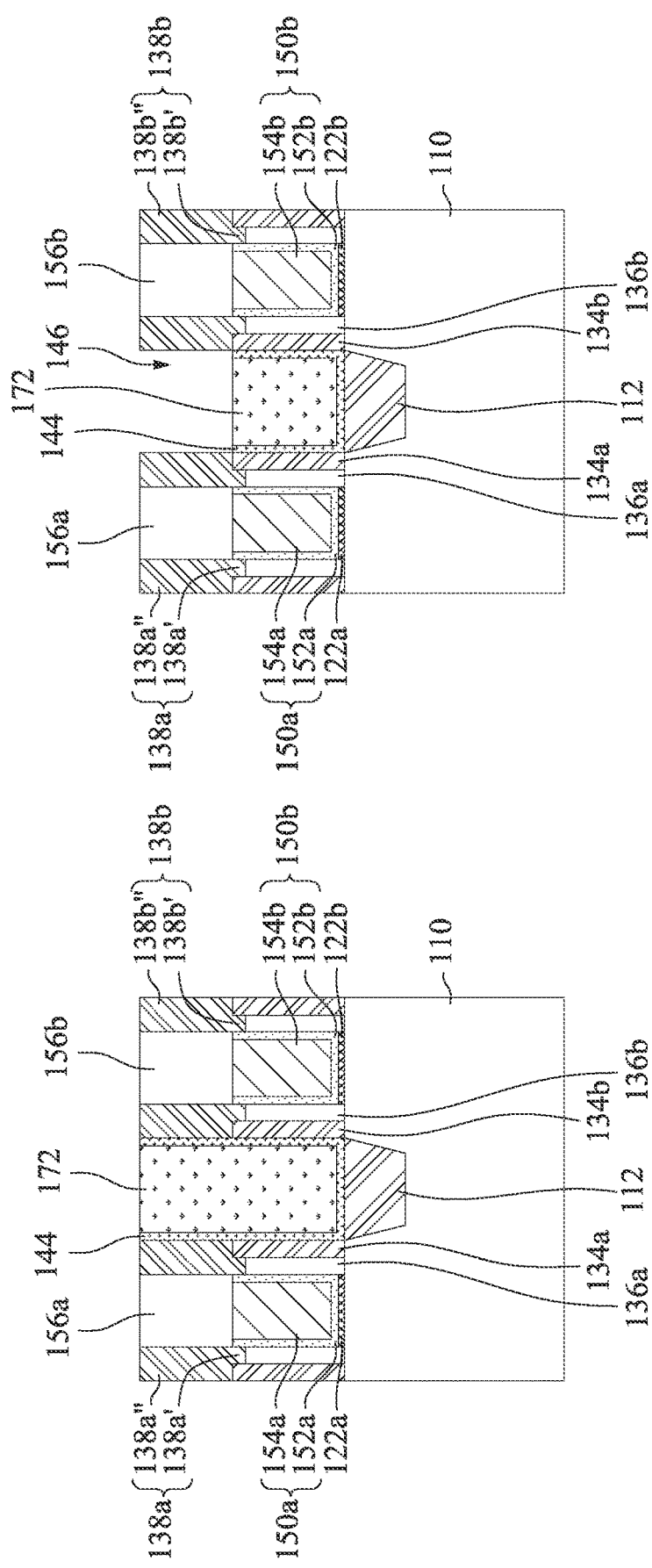

Reference is made to FIG. 16. The first barrier layer 144 and the bottom conductive feature 172 are etched back. A mask layer (not shown) may be formed over the first sacrificial layer 156a and 156b and the second spacers 138a and 138b during the etching process. As a result, a recess 146 is formed over the first barrier layer 144 and the bottom conductive feature 172, and a diameter of the recess 146 is defined by the sidewalls of the second portions 138a" and 138b" of the second spacers 138a and 138b. In some embodiments, a top surface of the bottom conductive feature 172 is coplanar with the top surfaces of the gate stacks 150a and 150b. In alternative embodiments, the top surface of the bottom conductive feature 172 is higher or lower than the top surfaces of the gate stacks 150a and 150b. Since the air spacers 136a and 136b are between the bottom conductive feature 172 and the gate stacks 150a and 150b, the air spacers 136a and 136b with an extremely low-k characteristic can effectively reduce the parasitic capacitance between the gate stacks 150a and 150b and the bottom conductive features 172.

Reference is made to FIG. 17. A second sacrificial material layer (not shown) is deposited over the semiconductor structure 100 shown in FIG. 16 by, for example, a CVD process, a PECVD process, the like, or combinations thereof. For example, the second sacrificial material layer is filled in the recess 146 (see FIG. 16), and formed over the second spacers 138a and 138b and the first sacrificial layers 156a and 156b. After that, a planarization process is then performed to lower the second sacrificial material layer and to expose the second spacers 138a and 138b and the first sacrificial layers 156a and 156b. In some embodiments, the second sacrificial material layer is planarized by using a CMP process. In other embodiments, other planarization techniques may be used, such as etching. As a result, a second sacrificial layer 174 is formed in the recess 146 to cover the bottom conductive feature 172 and the first barrier layer 144. A top surface of the second sacrificial layer 174 is coplanar with top surfaces of the second spacers 138a and 138b and top surfaces of the first sacrificial layers 156a and 156b. The material of the second sacrificial layer 174 (i.e., second sacrificial material layer) may include a porous and low-k material. Examples of the porous and low-k material are, but are not limited to, SiO, SiN, SiC, SiCN, SiON, SiOCN, the like, or combinations thereof. Such a material give an etching selectivity relative to the materials of the second spacers 138a and 138b (i.e., the second spacer material 138), which include, but are not limited to, high-k dielectric materials including AlO, AlN, AlON, ZrO, ZrN, ZrAlO, HfO, the like, or combinations thereof; or non-porous and low-k materials including SiO, SiN, SiC, SiCN, SiON, SiOCN, the like, or combinations thereof.

Reference is made to FIG. 18. A contact etch stop layer (CESL) 180 and a second ILD layer 182 are formed to blanket cover the first sacrificial layers 156a and 156b, the second sacrificial layer 174, and the second spacers 138a and 138b by a deposition process such as, for example, a CVD process, a PECVD process, a LPCVD process, the like, or a combination thereof. The material of the contact etch stop layer 280 includes, for example, SiO, SiN, SiC, SiCN, SiON, SiOCN, the like, or combinations thereof. Such a material give an etching selectivity relative to the materials of the second spacers 138a and 138b (i.e., the second spacer material 138), which include, but are not limited to, high-k dielectric materials including AlO, AlN, AlON, ZrO, ZrN, ZrAlO, HfO, the like, or combinations thereof; or non-porous and low-k materials including SiO, SiN, SiC, SiCN, SiON, SiOCN, the like, or combinations thereof. Additionally, the material of the second ILD layer 182 may include the same material as the material of the first ILD layer 140, which will not be repeated hereinafter.

Reference is made to FIG. 19. A first contact hole 183 is formed penetrating through the second ILD layer 182, the CESL 180, and the first sacrificial layer 156a. The first contact hole 183 may be formed using acceptable photolithography and etching techniques by removing portions of the second ILD layer 182, the CESL 180, and the first sacrificial layer 156a. Since the second spacer 138a has an etching selectivity in a range from about 10 to about 30 relative to the CESL 180 and the first sacrificial layer 156a, the etching process may stop at the second spacer 138a to prevent a further removal of the second spacer 138a. Hence, the first contact hole 183 is formed to expose a portion of the top surface of the gate stack 150a, a portion of the top surface of the second spacer 138a, and a portion of the sidewall of the second spacer 138a, resulting in a staircase configuration of the first contact hole 183. Stated differently, the first contact hole 183 has an upper portion 183a and a lower portion 183b, in which a diameter of the upper portion 183a is larger than that of the lower portion 183b, and a sidewall of the lower portion 183b of the first contact hole 183 is defined by the sidewall of the second spacer 138a. Furthermore, a sidewall of the second ILD layer 182 is coplanar with a sidewall of the CESL 180 and a sidewall of the first sacrificial layer 156a.

Reference is made to FIG. 20. A second contact hole 185 is formed penetrating through the second ILD layer 182, the CESL 180, and the second sacrificial layer 174. The second contact hole 185 may be formed using acceptable photolithography and etching techniques by removing portions of the second ILD layer 182, the CESL 180, and the second sacrificial layer 174. Since the second spacer 138b has an etching selectivity in a range from about 10 to about 30 relative to the CESL 180 and the second sacrificial layer 174, the etching process may stop at the second spacer 138b to prevent a further removal of the second spacer 138b. Hence, the second contact hole 185 is formed to expose a portion of the top surface of the bottom conductive feature 172, a portion of the top surface of the first barrier layer 144, a portion of the top surface of the second spacer 138b, and a portion of the sidewall of the second spacer 138b, resulting in a staircase configuration of the second contact hole 185. Stated differently, the second contact hole 185 has an upper portion 185a and a lower portion 185b, in which a diameter of the upper portion 185a is larger than that of the lower portion 185b, and a sidewall of the lower portion 185b of the second contact hole 185 is defined by the sidewall of the second spacer 138b. Furthermore, a sidewall of the second ILD layer 182 is coplanar with a sidewall of the CESL 180 and a sidewall of the second sacrificial layer 174.

Since the second spacers 138a and 138b has an etching selectivity in a range from about 10 to about 30 relative to the CESL 180, the first sacrificial layers 156a and 156b, and the second sacrificial layer 174, the first contact hole 183 and the second contact hole 185 do not penetrate through the second spacers 138a and 138b. Hence, the first spacers 134a and 134b and the air spacers 136a and 136b are not exposed and are well protected during the etching process due to the etching resistance provided by the second spacer 138a and 138b. If the etching selectivity of second spacer 138a and 138b relative to the CESL 180, the first sacrificial layers 156a and 156b, and the second sacrificial layer 174 is smaller than about 10, the etching process may lead to unwanted consumption of the underlying components, such as the first spacers 132a and 132b, thereby causing a risk for the first contact plug and the second contact plug (which will be formed respectively in the first contact hole 183 and the second contact hole 185 in subsequent steps) to be respectively in contact with the bottom conductive feature 172 and the gate stack 150b, hence enhancing a chance for shorting.

Additionally, the length L2 of the second portions 138a" and 138b" of the second spacers 138a and 138b which is in a range from about 1 nm to about 10 nm also contributes to the formation of the first contact hole 183 and the second contact hole 185. Specifically, if the length L2 of the second portions 138a" and 138b" of the second spacers 138a and 138b is smaller than about 1 nm, the etching process may easily lead to unwanted consumption of the underlying components, such as the first spacers 132a and 132b, thereby causing a risk for the first contact plug and the second contact plug (which will be formed respectively in the first contact hole 183 and the second contact hole 185 in subsequent steps) to be respectively in contact with the bottom conductive feature 172 and the gate stack 150b, hence enhancing a chance for shorting. On the other hand, if the length L2 of the second portions 138a" and 138b" is larger than about 10 nm, a vertical dimension of the semiconductor device 100 may be too large.

As a result, a larger process window for the first contact hole 183 and the second contact hole 185 can be achieved since the second spacer 138a and 138b can prevent the etching process from advancing further and retain the integrity of their underlying components. Furthermore, a height H1 of the first sacrificial layers 156a and 156b and a height H2 of the second sacrificial layer 174 can be reduced due to the strong buffering function provided by the material of the second spacer 138a and 138b. Additionally, a smaller height H1 of the first sacrificial layers 156a and 156b and a smaller height H2 of the second sacrificial layer 174 imply a smaller height of the dummy gate electrode layers 124a and 124b (see FIG. 4), which have been partially replaced by the first sacrificial layers 156a and 156b and the second sacrificial layer 174. Therefore, a dimension of the semiconductor device 100 is able to be reduced.

Reference is made to FIG. 21. A second barrier material layer 184 is conformally formed in the first contact hole 183 (see FIG. 20) and the second contact hole 185 (see FIG. 20), and a conductive material 186 is then deposited, such as by a CVD process, a PVD process, a PECVD process, a LPCVD process, the like, or a combination thereof, to fill in the first contact hole 183 and the second contact hole 185. The second barrier material layer 184 covers exposed surfaces of the second ILD layer 182, the CESL 180, the second spacer 138a and 138b, the first sacrificial layer 156a, the second sacrificial layer 174, the gate stack 150a, the second barrier layer 144, and the bottom conductive feature 172. In some embodiments, the second barrier material layer includes, but are not limited to, cobalt (Co), silver (Ag), aluminium (Al), zinc (Zn), calcium (Ca), gold (Au), magnesium (Mg), tungsten (W), molybdenum (Mo), nickel (Ni), chromium (Cr), the like, or combinations thereof. Furthermore, the conductive material layer 186 includes, but are not limited to, titanium nitride (TiN), tantalum nitride (TaN), tantalum (Ta), titanium (Ti), hafnium (Hf), zirconium (Zr), nickel (Ni), tungsten (W), cobalt (Co), copper (Cu), aluminium (Al), the like, or combinations thereof.

Reference is made to FIG. 22. A planarization process, such as a CMP process, is performed to remove excess portions of the second barrier material layer 184 and the conductive material 186, thus resulting in a formation of the first contact plug 190a and the second contact plug 190b respectively in the first contact hole 183 (see FIG. 20) and the second contact hole 185 (see FIG. 20). The first contact plug 190a penetrates through the first sacrificial layer 156a to make an electrical contact with the gate stack 150a, and the second contact plug 190b penetrates through the second sacrificial layer 174 to make an electrical contact with the bottom conductive feature 172 over the source/drain region 112. As a result, the first contact plug 190a and the second contact plug 190b are respectively formed in a staircase configuration. More specifically, the first contact plug 190a has an upper portion 190a' and a lower portion 190a", in which a sidewall of the upper portion 190a' is defined by sidewalls of the second ILD layer 182 and the CESL 180, while a sidewall of the lower portion 190a" is defined by sidewalls of the second spacer 138a and the first sacrificial layer 156a, and a diameter of the upper portion 190a' is larger than that of the lower portion 190a". Additionally, a sidewall of the lower portion 190a" of the first contact plug 190a in contact with the first sacrificial layer 156a is tilted with respect to the fin structure 110, while a sidewall of the lower portion 190a" of the first contact plug 190a in contact with the second spacer 138a is substantially straight and vertical with respect to the fin structure 110. Similarly, the second contact plug 190b has an upper portion 190b' and a lower portion 190b", in which a sidewall of the upper portion 190b' is defined by sidewalls of the second ILD layer 182 and the CESL 180, while a sidewall of the lower portion 190b" is defined by sidewalls of the second spacer 138b and the second sacrificial layer 174, and a diameter of the upper portion 190b' is larger than that of the lower portion 190b". Additionally, a sidewall of the lower portion 190b" of the first contact plug 190b in contact with the second sacrificial layer 174 is tilted with respect to the fin structure 110, while a sidewall of the lower portion 190b" of the first contact plug 190b in contact with the second spacer 138b is substantially straight and vertical with respect to the fin structure 110. Furthermore, a bottom surface 193a of the first contact plug 190a and a bottom surface 193b of the second contact plug 190b are coplanar with bottom surfaces 139a" and 139b" of the second portions 138a" and 138b" second spacers 138a and 138b.

In the following descriptions, another semiconductor device and a method of forming the same will be discussed.

Figures 23, 24:
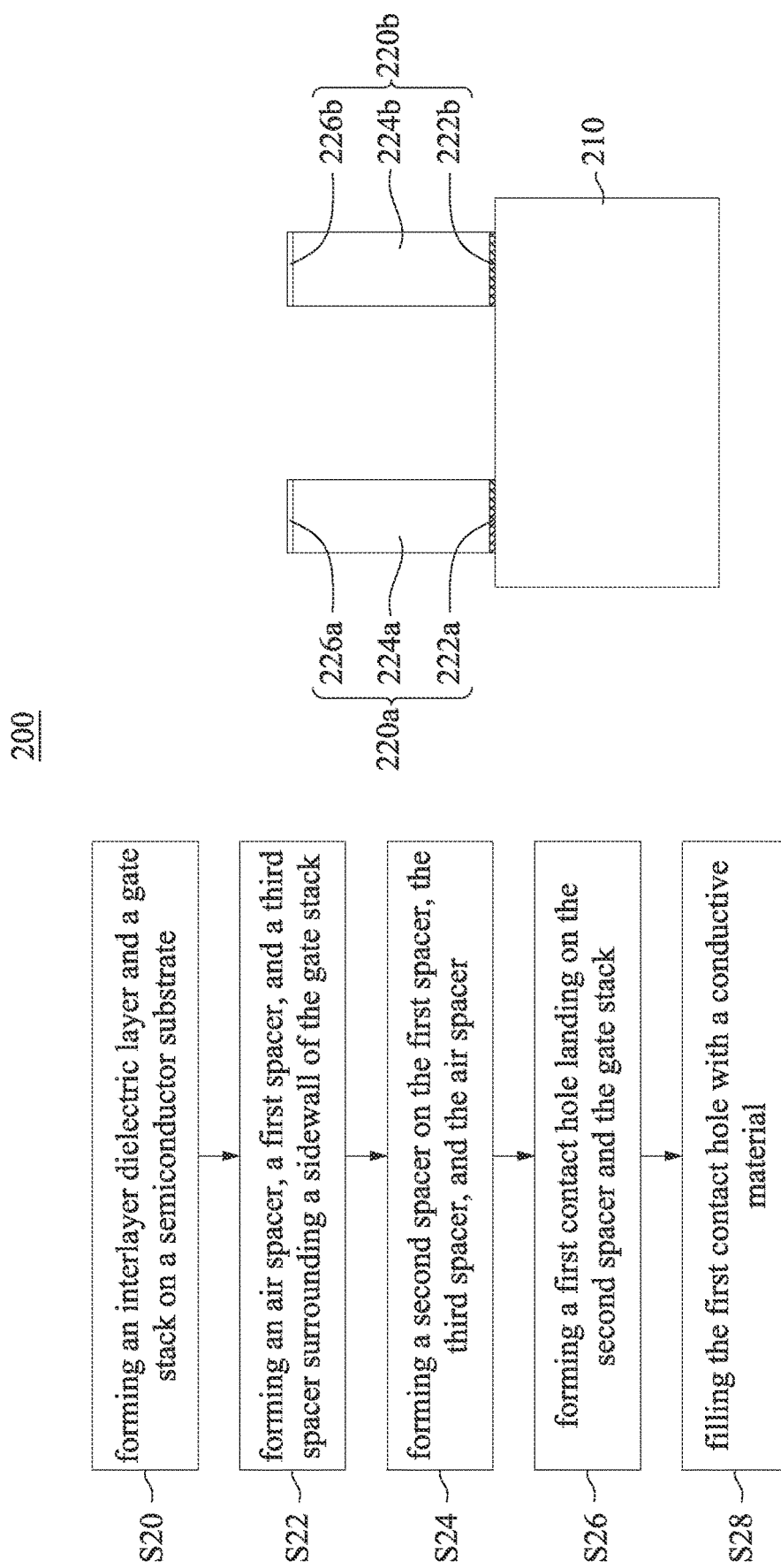

FIG. 23 is a flow chart illustrating a method of fabricating a semiconductor device in accordance with some embodiments of the present disclosure. The method begins with block 20 in which an interlayer dielectric layer and a gate stack are formed on a semiconductor substrate. The method continues with block 22 in which an air spacer and a first spacer are formed to surround a sidewall of the gate stack, wherein the first spacer is on a sidewall of the interlayer dielectric layer, and the air spacer is between the gate stack and the first spacer. The method continues with block 24 in which a second spacer is formed on the first spacer and the air spacer, wherein the second spacer has a portion in contact with a sidewall of the first spacer. The method continues with block 26 in which a first contact hole is formed to land on the second spacer and the gate stack, wherein a sidewall of the first contact hole is defined by the second spacer. The method continues with block 28 in which the first contact hole is filled with a conductive material.

As employed in the present disclosure, the semiconductor device 200 refers to any fin-based, multi-gate transistor. The semiconductor device 200 may be included in a microprocessor, memory cell, and/or other integrated circuit (IC). It is understood that additional processes may be provided before, during, and after the method of FIG. 23, and that some other processes may only be briefly described herein. Also, FIGS. 23 through 44 are simplified for a better understanding of the inventive concepts of the present disclosure. For example, although the figures illustrate the semiconductor device 200, it is understood the IC may include a number of other devices including resistors, capacitors, inductors, fuses, etc.

Reference is made to FIGS. 23-44, which are cross-sectional views illustrating the method for fabricating the semiconductor device 200 at various stages in accordance with some embodiments of the present disclosure.

Reference is made to FIG. 24. A substrate with a fin structure 210 is provided. The fin structure 210 is formed by etching into the substrate. In some embodiments, the substrate may be a semiconductor wafer such as a silicon wafer. Alternatively or additionally, the substrate may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP.

Afterwards, dummy gate structures, such as a first dummy gate structure 220a and a second dummy gate structure 220b are formed cross over the fin structure 210. The first dummy gate structure 220a includes a gate dielectric layer 222a, a dummy gate electrode layer 224a, and a hard mask 226a. The second dummy gate structure 220b includes a gate dielectric layer 222b, a dummy gate electrode layer 224b, and a hard mask 226b. The formation of the gate dielectric layers 222a and 222b and the dummy gate electrode layers 224a and 224b includes depositing a gate dielectric material layer (not shown) over the fin structure 210, depositing a dummy gate material layer (not shown) over the gate dielectric material layer, and patterning the dummy gate material layer and the gate dielectric material layer by an etching process, in accordance with some embodiments. The gate dielectric material layer and the dummy gate material layer may be deposited using a chemical vapor deposition (CVD) process. The hard masks 226a and 226b are formed over portions of the dummy gate material layer during the etching process, such that portions of the gate dielectric material layer and the dummy gate material layer not covered by the hard masks 226a and 226b are removed. In some embodiments, the material of the gate dielectric layers 222a and 222b includes silicon oxide, and the material of the dummy gate electrode layer 224a and 224b includes polysilicon.

Figure 25:
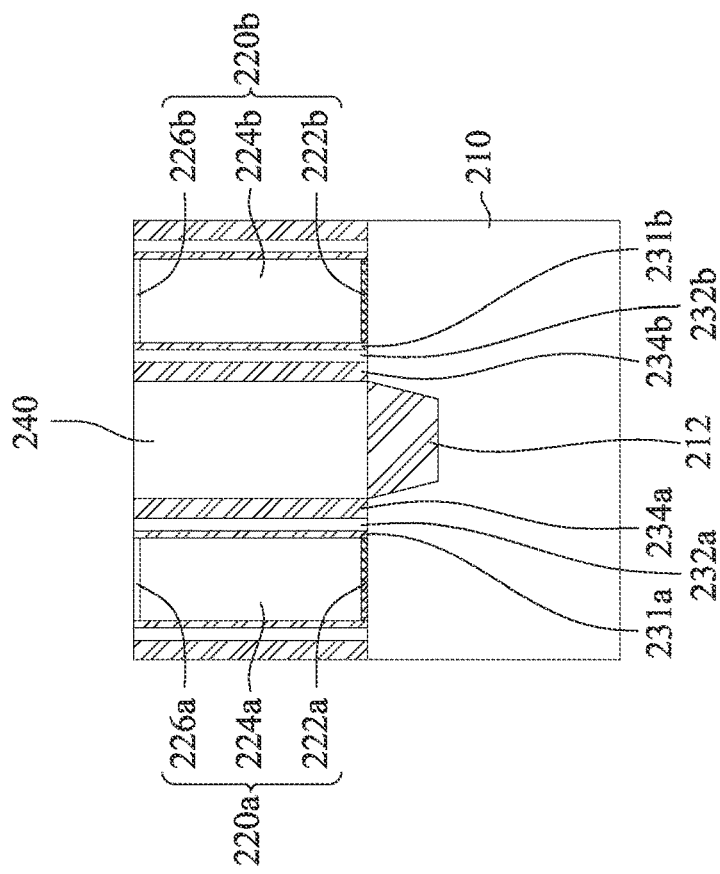

Reference is made to FIG. 25. Third spacers 231a and 231b are respectively formed on opposite sidewalls of the first and second dummy gate structures 220a and 220b. The third spacers 231a and 231b may be formed by conformally depositing a third spacer material layer (not shown) followed by an anisotropic etching (e.g., lateral etching) process. An example of the third spacer material layer may be a non-porous material including nitride. After the third spacers 231a and 231b are formed, low-k spacers 232a and 232b are respectively formed adjacent to the third spacers 231a and 231b. The low-k spacers 232a and 232b may be formed by conformally depositing a low-k spacer material layer (not shown) followed by an anisotropic etching (e.g., lateral etching) process. An example of the low-k spacer material may be a porous low-k material including SiOC, SiOCN, other suitable materials, or combinations thereof. Next, first spacers 234a and 234b are then respectively formed adjacent to the low-k spacers 232a and 232b. The first spacers 234a and 234b may be formed by conformally depositing a first spacer material layer (not shown) followed by an anisotropic etching (e.g., lateral etching) process. An example of the first spacer material layer may be a non-porous material including nitride. As a result, the low-k spacers 232a and 232b are formed between the first spacers 234a and 234b and the third spacers 231a and 231b, and the third spacers 231a and 231b are formed between the low-k spacers 232a and 232b and the first and second dummy gate structures 220a and 220b.

After the formation of the third spacers 231a and 231b, the low-k spacers 232a and 232b, and the first spacers 234a and 234b, a source/drain region 212 is formed in the substrate between the first and second dummy gate structures 220a and 220b. Although only one source/drain region 212 is illustrated in FIG. 25, a plurality of source/drain regions may be formed on opposite sides of the first and second dummy gate structures 220a and 220b. A dimension of the source/drain region 212 is defined by the first spacers 234a and 234b. In some embodiments, the source/drain region 212 may include the introduction of suitable dopant types, such as n-type or p-type dopants. The formation of the source/drain region 212 includes halo (or pocket) and/or low-dose drain (LDD) implantation, source/drain implantation, source/drain activation and/or other suitable processes. In other embodiments, the source/drain regions may include raised source/drain regions, strained regions, epitaxially grown regions, and/or other suitable techniques. In further embodiments, the source/drain activation process may include a rapid thermal annealing.

Figure 26:
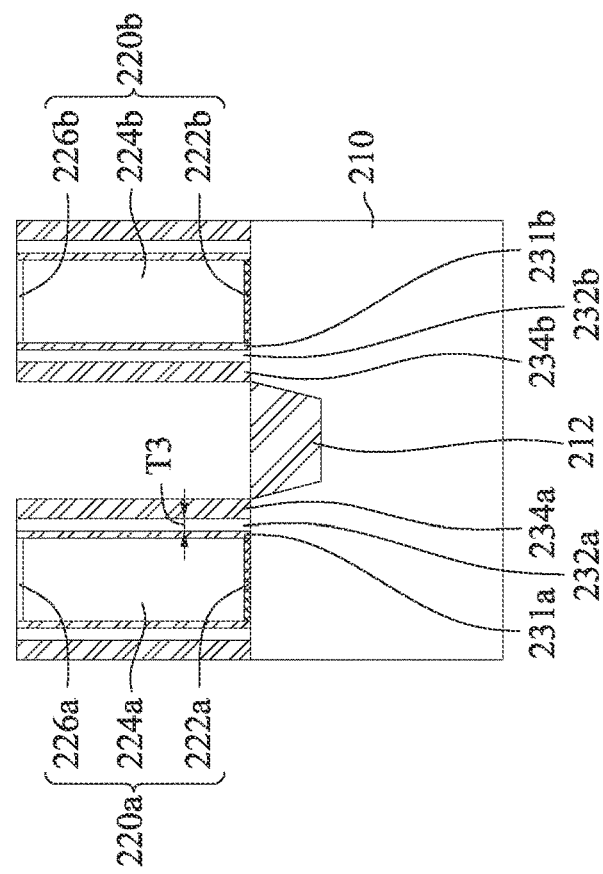

Reference is made to FIG. 26. A first interlayer dielectric (ILD) layer 240 is formed between the first and second dummy gate structures 220a and 220b, such that the first spacers 234a and 234b are on sidewalls of the ILD layer 240. The first ILD layer 240 may be formed by a CVD process, a high-density plasma (HDP) process, the like, or combinations thereof. In some embodiments, the first ILD layer 240 may be optionally planarized to lower its top surface to a level of first and second dummy gate structures 220a and 220b. For example, the first ILD layer 240 is planarized by using a chemical mechanical planarization (CMP) process. In other embodiments, other planarization techniques may be used, such as etching. The material of the first ILD layer 240 may include a dielectric material, such as a non-porous oxide material.

Reference is made to FIG. 27. The hard masks 226a and 226b (see FIG. 26) are removed after the first ILD layer 240 is formed. The dummy gate electrode layer 224a and 224b (see FIG. 26) are then removed to respectively form recesses 235a and 235b between the third spacers 231a and 231b. The removal of the dummy gate electrode layer 224a and 224b may be performed by a dry etching process which is selective to the material of the dummy gate electrode layer 224a and 224b. For example, if the dummy gate electrode layer 224a and 224b includes polysilicon, a dry etch using NF, SF, Cl, HBr, the like, or combinations thereof; or a wet etch using NH$_4$OH, tetramethylammonium hydroxide (TMAH), the like, or combinations thereof may be performed. In some embodiments, the etching of the dummy gate electrode layer 224a and 224b may stop at the gate dielectric layers 222a and 222b. As a result, the recesses 235a and 235b are formed to respectively expose the gate dielectric layers 222a and 222b. In alternative embodiments, the gate dielectric layers 222a and 222b may be removed along with the dummy gate electrode layer 224a and 224b. Diameters of the recesses 235a and 235b are respectively defined by sidewalls of the third spacers 231a and 231b.

Reference is made to FIG. 28. Gate stacks 250a and 250b are respectively formed in the recesses 235a and 235b (see FIG. 27). In some embodiments, the gate stacks 250a and 250b may include a single material or any combination of layers and different materials as may be appropriate. For example, the gate stacks 250a and 250b may include work function layers 252a and 252b and metal gate electrode layers 254a and 254b. The work function layers 252a and 252b and the metal gate electrode layers 254a and 254b are sequentially formed in the recesses 235a and 235b. For example, a work function material layer (not shown) is conformally formed in the recesses 235a and 235b covering the gate dielectric layers 222a and 222b and sidewalls of the third spacers 231a and 231b, and a metal gate electrode material layer (not shown) is then deposited, such as by a CVD process, a physical vapor deposition (PVD) process, the like, or a combination thereof, to fill in the recesses 235a and 235b. A planarization process, such as a CMP process, may be performed to remove excess portions of the metal gate electrode material layer and the work function material layer, in which the excess portions are over the top of the first ILD layer 240, the low-k spacers 232a and 232b, the first spacers 234a and 234b, and the third spacers 231a and 231b, thus resulting in a replacement of the dummy gate electrode layer 224a and 224b (see FIG. 26) and the hard masks 226a and 226b (see FIG. 26) with the gate stacks 250a and 250b including the work function layers 252a and 252b and the metal gate electrode layers 254a and 254b. The work function layers 252a and 252b may be tuned to have a proper work function. For example, if a p-type work function metal (p-metal) for a p-metal oxide semiconductor (pMOS) device is desired, p-type work function materials may be used. On the other hand, if an n-type work function metal (n-metal) for n-metal oxide semiconductor (nMOS) devices is desired, n-type work function materials may be used. The materials of the metal gate electrode layers 254a and 254b may include elemental metal, an alloy of metals, multiple layers of elemental metal, or combinations thereof, and can include tungsten (W), aluminium (Al), cobalt (Co), ruthenium (Ru), the like, or combinations thereof.

Reference is made to FIG. 29. The gate stacks 250a and 250b are etched back to a level approximately half the height of the third spacers 231a and 231b, the low-k spacers 232a and 232b, and the first spacers 234a and 234b. A mask layer (not shown) may be formed over the first ILD layer 240, the third spacers 231a and 231b, the low-k spacers 232a and 132b, and the first spacers 234a and 234b during the etching process. As a result, the recesses 235a and 235b are reappeared with a shallower depth, and upper portions of the third spacers 231a and 231b are exposed by the work function layers 252a and 252b of the gate stacks 250a and 250b.

Reference is made to FIG. 30. Upper portions of the third spacers 231a and 231b, upper portions of the low-k spacers 232a and 232b, and upper portions of the first spacers 234a and 234b are removed by an etching process, such as a wet etching process or a dry etching process. In some embodiments, the third spacers 231a and 231b, the low-k spacers 132a and 132b, and the first spacers 134a and 134b are etched back to a level higher than the gate stacks 250a and 250b. A mask layer (not shown) may be formed over the first ILD layer 240 during the etching process. As a result, top surfaces of the third spacers 231a and 231b, top surfaces of the low-k spacers 132a and 132b, and top surfaces of the first spacers 134a and 134b are coplanar. Additionally, recesses 237a and 237b are formed between the adjacent first ILD layers 240. The recesses 237a and 237b include upper portions 237a' and 237b' and lower portions 237a" and 237b", in which diameters of the upper portions 237a' and 237b' are defined by sidewalls of the adjacent first ILD layers 240, and diameters of the lower portions 237a" and 237b" are defined by sidewalls of the third spacers 231a and 231b. Hence, the diameters of the upper portions 237a' and 237b' of the recesses 237a and 237b are larger than those of the lower portions 237a" and 237b" of the recesses 237a and 237b.

Reference is made to FIG. 31. The remaining low-k spacers 232a and 232b are then removed, such that spaces 236 are formed between the third spacers 231a and 231b and the first spacers 234a and 234b, and portions of the fin structure 210 are exposed from the spaces 236. The removal of the low-k spacers 232a and 232b may be performed by an etching process, such as a wet etching process or a dry etching process. In some embodiments, the material of the low-k spacers 232a and 232b, such as SiOC or SiOCN, gives an etching selectivity relative to the material of the first ILD layer 240, the first spacers 234a and 234b, and the third spacers 231a and 231b which including oxide, nitride and nitride, respectively. In alternative embodiments, the porous material of the low-k spacers 232a and 232b gives an etching selectivity relative to the non-porous materials of the first ILD layer 240, the first spacers 234a and 234b, and the third spacers 231a and 231b. As a result, sidewalls of the first spacers 234a and 234b and sidewalls of the third spacers 231a and 231b are exposed from the spaces 236.

Reference is made to FIG. 32. A second spacer material 238 is conformally formed on the semiconductor structure 200 shown in FIG. 31 by deposition. For example, the second spacer material 238 covers the first ILD layer 240, the gate stacks 250a and 250b, the first spacers 232a and 232b, the spaces 236, and the third spacers 231a and 231b, and is formed on sidewalls of the first ILD layer 240 and sidewalls of the third spacers 231a and 231b. In some embodiments, the second spacer material 238 has portions 238' embedded into the spaces 236 and in contact with sidewalls of the third spacers 231a and 231b and sidewalls of the first spacers 234a and 234b. Hence, spaces 236 are reappeared with a smaller height and are referred to as air spacers 236a and 236b in the following descriptions. The air spacers 236a and 236b having an extremely low-k characteristic are formed to reduce parasitic capacitance of the semiconductor device 200. Examples of the second spacer material 238 include, but are not limited to, high-k dielectric materials including AlO, AlN, AlON, ZrO, ZrN, ZrAlO, HfO, the like, or combinations thereof; or non-porous and low-k materials including SiO, SiN, SiC, SiCN, SiON, SiOCN, the like, or combinations thereof. Since the third spacers 231a and 231b are between the gate stacks 250a and 250b and the spaces 236, the second spacer material 238 can formed on sidewalls of the third spacers 231a and 231b instead of deeply filling into the spaces 236.

Since a thickness T3 of the removed low-k spacers 232a and 232b (see FIG. 25) is in a range from about 1 nm to about 10 nm, a width W3 of the spaces 236 (see FIG. 31) is in a range from about 1 nm to about 10 nm, and a width W3 of the air spacers 236a and 236b is in a range from about 1 nm to about 10 nm. In order to ensure the functionality of the air spacers 236a and 236b, a height of the air spacers 236a and 236b should not be too small, and since a length L3 of the portions 238' of the second spacer material 238 extending into the spaces 236 affects the height of the air spacers 236a and 236b, the length L3 of the portions 238' of the second spacer material 238 extending into the spaces 236 should not be too large. The length L3 of the portions 238' of the second spacer material 238 extending into the spaces 236 is controlled by the width W3 of the spaces 236 which is in a range from about 1 nm to about 10 nm. For example, if the width W3 of the spaces 236 is larger than about 10 nm, the second spacer material 238 may easily fill in the spaces 236 at a large extent during the deposition, resulting in a decrease in height of the air spacers 236a and 236b, or even an entire filling-up of the spaces 236. On the other hand, if the width W3 of the spaces 236 is smaller than about 1, which means the thickness T3 of the removed low-k spacer 232a and 232b is smaller than about 1, the formation of the spaces 236 may be difficult since bottom portions of the low-k spacers 232a and 232b may be difficult to remove due to the small thickness T3. In some embodiments, the length L3 of the portions 238' of the second spacer material 238 extending into the spaces 136 is in a range from about 0.5 nm to about 5 nm to ensure that the height of the air spacers 236a and 236b is in an appropriate range to maintain their functionality (i.e., to reduce parasitic capacitance of the semiconductor device 200). As a result, a height of the air spacers 236a and 236b is larger than a height of the gate stacks 250a and 250b.

Figures 33, 34:
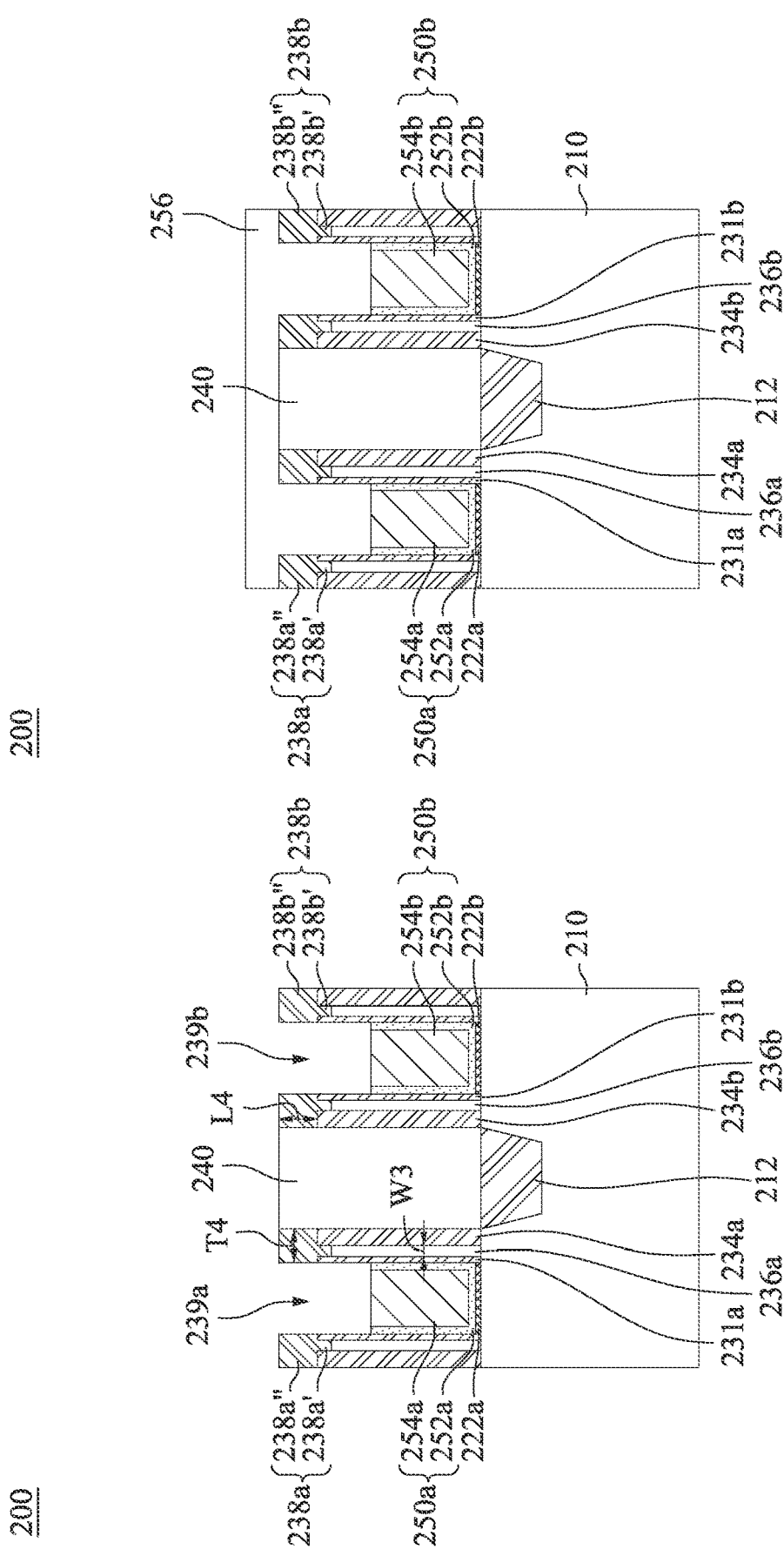

Reference is made to FIG. 33. An etching process such as a wet etching process is performed, such that portions of the second spacer material 238 (see FIG. 22) are removed. For example, portions of the second spacer material 238 covering the gate stacks 250a and 250b and the first ILD layer 240 are removed, and portions of the second spacer material 238 on the sidewalls of the third spacers 231a and 231b are also removed. As a result, second spacers 238a and 238b are formed standing on the first spacers 232a and 232b, the air spacers 236a and 236b, and the third spacers 231a and 231b, and recesses 239a and 239b are respectively formed between the second spacers 238a and 238b and between the third spacers 231a and 231b, that is, diameters of the recesses 239a and 239b are respectively defined by sidewalls of the second spacers 238a and 238b and respectively defined by sidewalls of the third spacers 231a and 231b. The gate stacks 250a and 250b are exposed by the third spacers 231a and 231b, and top surfaces of the second spacers 238a and 238b are coplanar with the top surface of the first ILD layer 240. In some embodiments, a thickness T4 of the second spacers 238a and 238b is in a range from about 1 nm to about 10 nm. Furthermore, the thickness T4 of the second spacers 238a and 238b should be larger than the width W3 of air spacers 236a and 236b to ensure the air spacers 236a and 236b being entirely sealed. If the thickness T4 of the second spacers 238a and 238b is smaller than about 1 nm, the air spacers 236a and 236b may possibly be exposed, resulting in a fragile structure of the semiconductor device 100; if the thickness T4 of the second spacers 138a and 138b is larger than about 10 nm, the size of the semiconductor device 200 would be increased accordingly.

After this step, the second spacers 238a and 238b including first portions 238a' and 238b' and second portions 238a" and 238b" are formed. The first portions 238a' and 238b' are the portions 238' of the second spacer material 238 extending into the spaces 236 (see FIG. 30) and are in contact with sidewalls of the first spacers 234a and 234b and sidewalls of the third spacers 231a and 231b. The second portions 238a" and 238b" are on the first portions 238a' and 238b' of the second spacers 238a and 238b, the first spacers 234a and 234b, and the third spacers 231a and 231b.

Reference is made to FIG. 34. A first sacrificial material layer 256 is deposited over the semiconductor structure 200 shown in FIG. 33 by, for example, a CVD process, a plasma enhanced chemical vapor deposition (PECVD) process, the like, or combinations thereof. For example, the first sacrificial material layer 256 is filled in the recesses 239a and 239b (see FIG. 33), and formed over the second spacers 238a and 238b and the first ILD layer 240. The material of the first sacrificial material layer 256 may include a porous and low-k material. Examples of the porous and low-k material are, but not limited to, SiO, SiN, SiC, SiCN, SiON, SiOCN, the like, or combinations thereof. Such a material give an etching selectivity relative to the materials of the second spacers 238a and 238b (i.e., the second spacer material 238), which include, but not limited to, high-k dielectric materials including AlO, MN, AlON, ZrO, ZrN, ZrAlO, HfO, the like, or combinations thereof; or non-porous and low-k materials including SiO, SiN, SiC, SiCN, SiON, SiOCN, the like, or combinations thereof.

Reference is made to FIG. 35. A planarization process is performed to lower the first sacrificial material layer 256 and to expose the second spacers 238a and 238b. In some embodiments, the first sacrificial material layer 256 is planarized by using a CMP process. In other embodiments, other planarization techniques may be used, such as etching. As a result, first sacrificial layers 256a and 256b are respectively formed in the recesses 239a and 239b (see FIG. 33), and are respectively formed between the second spacers 238a and 238b and respectively between the third spacers 231a and 231b. Additionally, top surfaces of the first sacrificial layers 256a and 256b are coplanar with top surfaces of the second spacers 238a and 238b and the top surface of the first ILD layer 240. Furthermore, the third spacers 231a and 231b respectively extend along sidewalls of the first sacrificial layers 256a and 256b.

Reference is made to FIG. 36. The first ILD layer 240 is removed by an etching process. A mask layer (not shown) may be formed over the first sacrificial layer 256a and 256b and the second spacers 238a and 238b during the etching process. The removal of the first ILD layer 240 results in a formation of a recess 242 above the underlying source/drain region 212, that is, an exposure of the underlying source/drain region 212 from the recess 242.

Reference is made to FIG. 37. A first barrier layer 244 and a bottom conductive feature 272 are sequentially formed in the recess 242 (see FIG. 36). In some embodiments, a first barrier material layer (not shown) is conformally formed in the recess 242 covering the source/drain region 212, sidewalls of the first spacers 234a and 234b, and sidewalls of the second spacers 138a and 138b, and a bottom conductive material (not shown) is then deposited, such as by a CVD process, a PVD process, a PECVD process, a low pressure CVD (LPCVD) process, the like, or a combination thereof, to fill in the recess 242. A planarization process, such as a CMP process, may be performed to remove excess portions of the first barrier material layer and the bottom conductive material, and thus resulting in a replacement of the first ILD layer 240 with the first barrier layer 244 and the bottom conductive feature 272. In some embodiments, the first barrier material layer includes, but are not limited to, cobalt (Co), silver (Ag), aluminium (Al), zinc (Zn), calcium (Ca), gold (Au), magnesium (Mg), tungsten (W), molybdenum (Mo), nickel (Ni), chromium (Cr), the like, or combinations thereof. Additionally, the bottom conductive material includes conductive materials, such as tungsten (W), aluminium (Al), cobalt (Co), ruthenium (Ru), the like, or combinations thereof, which form an electrical connection to the source/drain region 212. In some embodiments, other layers such as a work function layer and/or a capping layer may be formed in the recess 242, but the present disclosure is not limited in this regard.

Reference is made to FIG. 38. The first barrier layer 244 and the bottom conductive feature 272 are etched back. A mask layer (not shown) may be formed over the first sacrificial layers 256a and 256b and the second spacers 238a and 238b during the etching process. As a result, a recess 246 is formed over the first barrier layer 244 and the bottom conductive feature 272, and a diameter of the recess 246 is defined by the sidewalls of the second spacers 238a and 238b and sidewalls of the third spacers 231a and 231b. In some embodiments, a top surface of the bottom conductive feature 272 is coplanar with the top surfaces of the gate stacks 250a and 250b. In alternative embodiments, the top surface of the bottom conductive feature 272 is higher or lower than the top surfaces of the gate stacks 250a and 250b. Since the air spacers 236a and 236b are between the bottom conductive feature 272 and the gate stacks 250a and 250b, the air spacers 236a and 236b with an extremely low-k characteristic can effectively reduce the parasitic capacitance between the gate stacks 250a and 250b and the bottom conductive features 272.

Reference is made to FIG. 39. A second sacrificial material layer (not shown) is deposited over the semiconductor structure 200 shown in FIG. 38 by, for example, a CVD process, a PECVD process, the like, or combinations thereof. For example, the second sacrificial material layer is filled in the recess 246 (see FIG. 38), and formed over the second spacers 238a and 238b and the first sacrificial layers 256a and 256b. After that, a planarization process is then performed to lower the second sacrificial material layer and to expose the second spacers 238a and 238b and the first sacrificial layers 256a and 256b. In some embodiments, the second sacrificial material layer is planarized by using a CMP process. In other embodiments, other planarization techniques may be used, such as etching. As a result, a second sacrificial layer 274 is formed in the recess 246 to cover the bottom conductive feature 272 and the first barrier layer 244. A top surface of the second sacrificial layer 274 is coplanar with top surfaces of the second spacers 238a and 238b and top surfaces of the first sacrificial layers 256a and 256b. The material of the second sacrificial layer 274 (i.e., second sacrificial material layer) may include a porous and low-k material. Examples of the porous and low-k material are, but are not limited to, SiO, SiN, SiC, SiCN, SiON, SiOCN, the like, or combinations thereof. Such a material give an etching selectivity relative to the materials of the second spacers 238a and 238b (i.e., the second spacer material 238), which include, but are not limited to, high-k dielectric materials including AlO, AlN, AlON, ZrO, ZrN, ZrAlO, HfO, the like, or combinations thereof; or non-porous and low-k materials including SiO, SiN, SiC, SiCN, SiON, SiOCN, the like, or combinations thereof.

Reference is made to FIG. 40. A contact etch stop layer (CESL) 280 and a second ILD layer 282 are formed to blanket cover the first sacrificial layers 256a and 256b, the second sacrificial layer 274, and the second spacers 238a and 238b by a deposition process such as, for example, a CVD process, a PECVD process, a LPCVD process, the like, or a combination thereof. The material of the contact etch stop layer 280 includes, for example, SiO, SiN, SiC, SiCN, SiON, SiOCN, the like, or combinations thereof. Such a material give an etching selectivity relative to the materials of the second spacers 238a and 238b (i.e., the second spacer material 238), which include, but are not limited to, high-k dielectric materials including AlO, AlN, AlON, ZrO, ZrN, ZrAlO, HfO, the like, or combinations thereof; or non-porous and low-k materials including SiO, SiN, SiC, SiCN, SiON, SiOCN, the like, or combinations thereof. Additionally, the material of the second ILD layer 282 may include the same material as the material of the first ILD layer 240, which will not be repeated hereinafter.

Figures 41, 42:
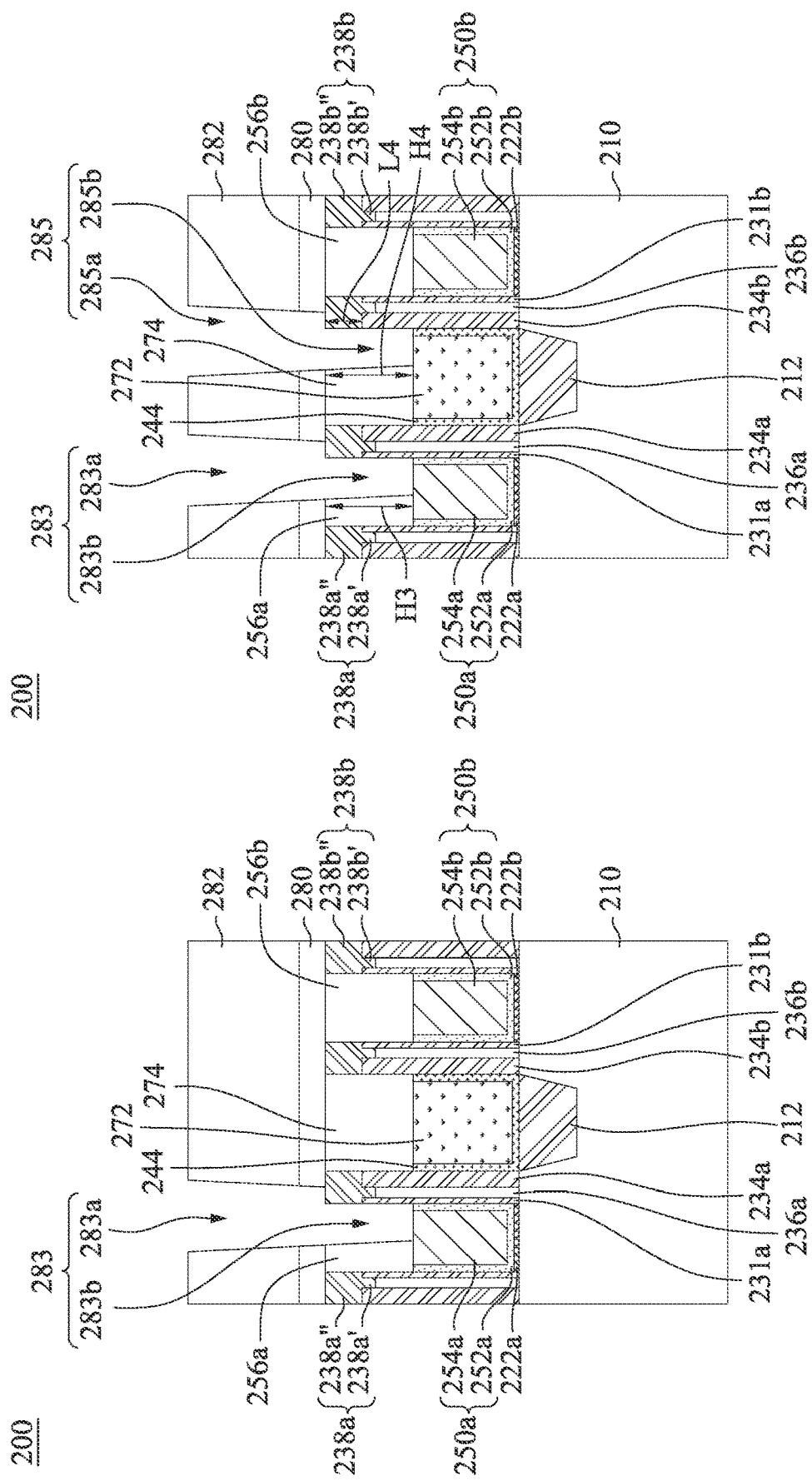

Reference is made to FIG. 41. A first contact hole 283 is formed penetrating through the second ILD layer 282, the CESL 280, and the first sacrificial layer 256a. The first contact hole 183 may be formed using acceptable photolithography and non-isotropic etching techniques, such as a reactive-ion etching (RIE), by removing portions of the second ILD layer 282, the CESL 280, and the first sacrificial layer 256a. Since the second spacers 238a have an etching selectivity in a range from about 10 to about 30 relative to the CESL 280 and the first sacrificial layer 256a, the etching process may stop at the second spacers 238a to prevent a further removal of the second spacers 238a and the underlying third spacers 231a. Furthermore, since the removal is performed by a non-isotropic etching process without any lateral etching, a sidewall of the third spacer 231a exposed from the first contact hole 283 is able to be retained and remained substantially straight. Hence, the first contact hole 283 is formed to expose a portion of the top surface of the gate stack 250a, a portion of the top surface of the second spacer 238a, a portion of the sidewall of the second spacer 138a, and a portion of the sidewall of the third spacers 231a, resulting in a staircase configuration of the first contact hole 283. Stated differently, the first contact hole 283 has an upper portion 283a and a lower portion 283b, in which a diameter of the upper portion 283a is larger than that of the lower portion 283b, and a sidewall of the lower portion 283b of the first contact hole 283 is defined by the sidewall of the second spacers 238a and the sidewall of the third spacers 231a. Furthermore, a sidewall of the second ILD layer 282 is coplanar with a sidewall of the CESL 280 and a sidewall of the first sacrificial layer 256a.

Reference is made to FIG. 42. A second contact hole 285 is formed penetrating through the second ILD layer 282, the CESL 280, and the second sacrificial layer 274. The second contact hole 285 may be formed using acceptable photolithography and non-isotropic etching techniques, such as a reactive-ion etching (RIE), by removing portions of the second ILD layer 282, the CESL 280, and the second sacrificial layer 274. Since the second spacers 238b have an etching selectivity in a range from about 10 to about 30 relative to the CESL 280 and the second sacrificial layer 274, the etching process may stop at the second spacers 238b to prevent a further removal of the second spacers 238b and the underlying third spacers 231b. Furthermore, since the removal is performed by a non-isotropic etching process without any lateral etching, a sidewall of the first spacer 234b exposed from the second contact hole 285 is able to be retained and remained substantially straight. Hence, the second contact hole 285 is formed to expose a portion of the top surface of the bottom conductive feature 272, a portion of the top surface of the first barrier layer 244, a portion of the top surface of the second spacers 238b, a portion of the sidewall of the second spacers 138b, and a portion of the sidewall of the third spacers 231b, resulting in a staircase configuration of the second contact hole 285. Stated differently, the second contact hole 285 has an upper portion 285a and a lower portion 285b, in which a diameter of the upper portion 285a is larger than that of the lower portion 285b, and a sidewall of the lower portion 285b of the second contact hole 285 is defined by the sidewall of the second spacers 138b and the sidewall of the first spacers 234b. Furthermore, a sidewall of the second ILD layer 282 is coplanar with a sidewall of the CESL 280 and a sidewall of the second sacrificial layer 274.

Since the second spacers 238a and 238b has an etching selectivity in a range from about 10 to about 30 relative to the CESL 280, the first sacrificial layers 256a and 256b, and the second sacrificial layer 274, the first contact hole 283 and the second contact hole 285 do not penetrate through the second spacers 238a and 238b. Hence, the first spacers 234a and 234b and the air spacers 136a and 136b are not exposed and are well protected during the etching process due to the etching resistance provided by the second spacer 238a and 238b. If the etching selectivity of second spacer 238a and 238b relative to the CESL 280, the first sacrificial layers 256a and 256b, and the second sacrificial layer 274 is smaller than about 10, the etching process may lead to unwanted consumption of the underlying components, such as the third spacers 231a and 231b, the first spacers 234a and 234b, and the air spacers 136a and 136b, thereby causing a risk for the first contact plug and the second contact plug (which will be formed respectively in the first contact hole 283 and the second contact hole 285 in subsequent steps) to be respectively in contact with the bottom conductive feature 272 and the gate stack 250b, hence enhancing a chance for shorting.

Additionally, the length L4 of the second portions 238a" and 238b" of the second spacers 238a and 238b which is in a range from about 1 nm to about 10 nm also contributes to the formation of the first contact hole 283 and the second contact hole 285. Specifically, if the length L4 of the second portions 238a" and 238b" of the second spacers 238a and 238b is smaller than about 1 nm, the etching process may easily lead to unwanted consumption of the underlying components, such as the third spacers 231a and 231b, the first spacers 234a and 234b, and the air spacers 136a and 136b, thereby causing a risk for the first contact plug and the second contact plug (which will be formed respectively in the first contact hole 283 and the second contact hole 285 in subsequent steps) to be respectively in contact with the bottom conductive feature 272 and the gate stack 250b, hence enhancing a chance for shorting. On the other hand, if the length L4 of the second portions 238a" and 238b" of the second spacers 238a and 238b is larger than about 10 nm, a vertical dimension of the semiconductor device 200 may be too large.

As a result, a larger process window for the first contact hole 283 and the second contact hole 285 can be achieved since the second spacer 238a and 238b can prevent the etching process from advancing further and retain the integrity of their underlying components. Furthermore, a height H3 of the first sacrificial layers 256a and 256b and a height H4 of the second sacrificial layer 274 can be reduced due to the strong buffering function provided by the material of the second spacer 238a and 238b. Additionally, a smaller height H3 of the first sacrificial layers 256a and 256b and a smaller height H4 of the second sacrificial layer 174 imply a smaller height of the dummy gate electrode layers 224a and 224b (see FIG. 26), which have been partially replaced by the first sacrificial layers 256a and 256b and the second sacrificial layer 274. Therefore, a dimension of the semiconductor device 200 is able to be reduced.

Figures 43, 44:
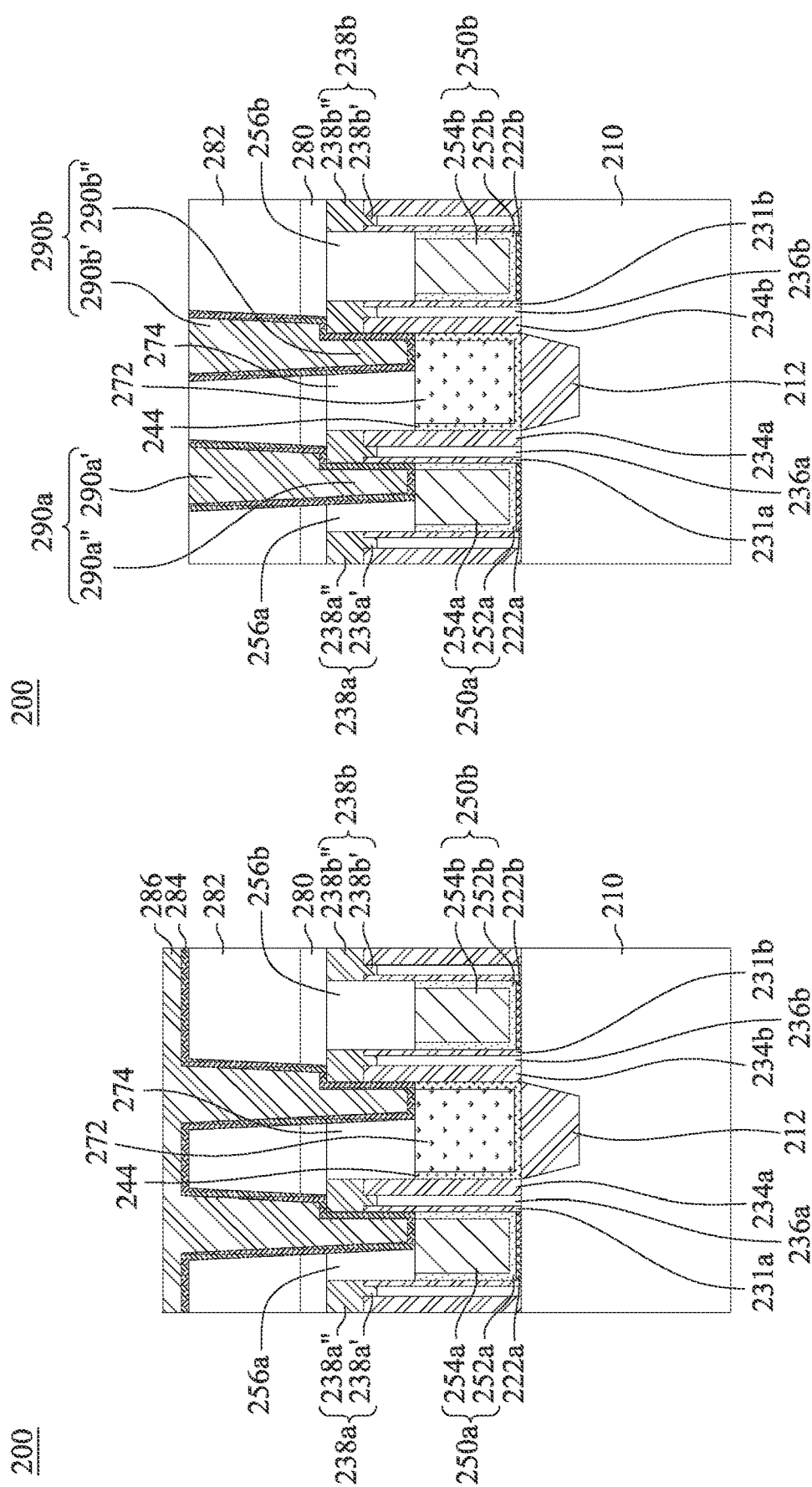

Reference is made to FIG. 43. A second barrier material layer 284 is conformally formed in the first contact hole 283 (see FIG. 42) and the second contact hole 285 (see FIG. 42), and a conductive material 286 is then deposited, such as by a CVD process, a PVD process, a PECVD process, a LPCVD process, the like, or a combination thereof, to fill in the first contact hole 283 and the second contact hole 285. The second barrier material layer 284 covers exposed surfaces of the second ILD layer 282, the CESL 280, the second spacer 238a and 238b, the third spacers 231a and 231b, the first sacrificial layer 256a, the second sacrificial layer 274, the gate stack 250a, the second barrier layer 244, and the bottom conductive feature 272. In some embodiments, the second barrier material layer 284 includes, but are not limited to, cobalt (Co), silver (Ag), aluminium (Al), zinc (Zn), calcium (Ca), gold (Au), magnesium (Mg), tungsten (W), molybdenum (Mo), nickel (Ni), chromium (Cr), the like, or combinations thereof. Furthermore, the conductive material layer 286 includes, but are not limited to, titanium nitride (TiN), tantalum nitride (TaN), tantalum (Ta), titanium (Ti), hafnium (Hf), zirconium (Zr), nickel (Ni), tungsten (W), cobalt (Co), copper (Cu), aluminium (Al), the like, or combinations thereof.

Reference is made to FIG. 44. A planarization process, such as a CMP process, is performed to remove excess portions of the second barrier material layer 284 and the conductive material 286, thus resulting in a formation of the first contact plugs 290a and the second contact plug 290b respectively in the first contact hole 283 (see FIG. 42) and the second contact hole 285 (see FIG. 42). The first contact plug 290a penetrates through the first sacrificial layer 256a to make an electrical contact with the gate stack 250a, and the second contact plug 290b penetrates through the second sacrificial layer 274 to make an electrical contact with the bottom conductive feature 272 over the source/drain region 212. As a result, the first contact plug 290a and the second contact plug 290b are respectively formed in a staircase configuration. More specifically, the first contact plug 290a has an upper portion 290a' and a lower portion 290a", in which a sidewall of the upper portion 290a' is defined by sidewalls of the second ILD layer 282 and the CESL 280, while a sidewall of the lower portion 290a" is defined by sidewalls of the second spacers 238a, the third spacers 231a, and the first sacrificial layer 156a, and a diameter of the upper portion 290a' is larger than that of the lower portion 290a". Additionally, a sidewall of the lower portion 290a" of the first contact plug 290a in contact with the first sacrificial layer 256a is tilted with respect to the fin structure 210, while a sidewall of the lower portion 290a" of the first contact plug 290a in contact with the second spacer 238a and the third spacer 231a is substantially straight and vertical with respect to the fin structure 210. Similarly, the second contact plug 290b has an upper portion 290b' and a lower portion 290b", in which a sidewall of the upper portion 290b' is defined by sidewalls of the second ILD layer 282 and the CESL 280, while a sidewall of the lower portion 290b" is defined by sidewalls of the second spacer 238b, the first spacers 234b, and the second sacrificial layer 274, and a diameter of the upper portion 290b' is larger than that of the lower portion 290b". Additionally, a sidewall of the lower portion 290b" of the first contact plug 290b in contact with the second sacrificial layer 274 is tilted with respect to the fin structure 210, while a sidewall of the lower portion 290b" of the first contact plug 290b in contact with the second spacer 238b and the first spacer 234b is substantially straight and vertical with respect to the fin structure 210.

Based on the aforementioned descriptions, various advantages may be provided by the present disclosure. More specifically, since the second spacers have an etching selectivity relative to the first sacrificial layer, second sacrificial layer, and the contact etch stop layer, the second spacers have the capability to endure the etching treatment and therefore protect the underlying components, such as the first spacers, the air spacers, and the third spacers during the contact hole formation process. As such, the overall height of the gate stack is reduced due to the strong buffering function provided by the second spacers. Additionally, the air spacers with an extremely low-k characteristic can effectively reduce the parasitic capacitance between the gate stacks and the bottom conductive features, thus enhancing the performance of the semiconductor device.

In some embodiments, a semiconductor device includes a semiconductor substrate, a gate stack, an air spacer, a first spacer, a second spacer, a sacrificial layer, and a contact plug. The gate stack is on the semiconductor substrate. The air spacer is around the gate stack. The first spacer is around the air spacer. The second spacer is on the air spacer and the first spacer. The sacrificial layer is on the gate stack, and an etching selectivity between the second spacer and the sacrificial layer is in a range from about 10 to about 30. The contact plug lands on the second spacer and the gate stack.

In some embodiments, a semiconductor device includes a semiconductor substrate, a gate stack, an air spacer, a first spacer, a second spacer, a third spacer, and a first sacrificial layer. The gate stack is on the semiconductor substrate. The air spacer is around the gate stack. The first spacer is around the air spacer. The second spacer is on the air spacer and the first spacer. The third spacer is between the gate stack and the air spacer. The first sacrificial layer is on the gate stack, and the third spacer extends along a sidewall of the first sacrificial layer.

In some embodiments, a method of fabricating a semiconductor device including: forming an interlayer dielectric layer and a gate stack on a semiconductor substrate; forming an air spacer and a first spacer surrounding a sidewall of the gate stack, wherein the first spacer is on a sidewall of the interlayer dielectric layer, and the air spacer is between the gate stack and the first spacer; forming a second spacer on the first spacer and the air spacer, wherein the second spacer has a portion in contact with a sidewall of the first spacer; forming a first contact hole landing on the second spacer and the gate stack, wherein a sidewall of the first contact hole is defined by the second spacer; and filling the first contact hole with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dummy gate over a substrate;
    forming a first spacer on a sidewall of the dummy gate;
    replacing the dummy gate with a gate structure;
    removing a top portion of the first spacer;
    after removing the top portion of the first spacer, forming a second spacer over the first spacer, wherein the second spacer has a stepped bottom surface with an upper step in contact with a top surface of the first spacer and a lower step lower than the top surface of the first spacer;
    forming a contact plug contacting the gate structure and the second spacer;
    forming a third spacer on the sidewall of the dummy gate prior to forming the first spacer, wherein the third spacer is between the dummy gate and the first spacer; and
    removing the third spacer prior to forming the second spacer.

2. The method of claim 1, further comprising forming a dielectric cap over the gate structure after forming the second spacer.

3. The method of claim 2, wherein the dielectric cap is in contact with the second spacer.

4. The method of claim 2, wherein after forming the dielectric cap, a top surface of the dielectric cap is substantially coplanar with a top surface of the second spacer.

5. The method of claim 2, wherein the contact plug is further in contact with the dielectric cap.

6. A method comprising:
    providing a workpiece comprising:
        a source/drain epitaxial structure over a substrate;
        a gate structure over the substrate;
        a first spacer between the gate structure and the source/drain epitaxial structure; and
        an interlayer dielectric (ILD) layer over the source/drain epitaxial structure and surrounding the first spacer and the gate structure;
    etching back the first spacer;
    forming a second spacer over the first spacer after etching back the first spacer;
    forming a recess in the ILD layer to expose the source/drain epitaxial structure, a sidewall of the first spacer, and a sidewall of the second spacer;
    filling a conductive material in the recess; and
    forming a dielectric cap over the conductive material and in contact with the sidewall of the first spacer, wherein a bottom surface of the dielectric cap is lower than a top surface of the first spacer.

7. The method of claim 6, wherein the first spacer is made of a non-porous material.

8. The method of claim 6, wherein the second spacer comprises high-k dielectric materials or non-porous low-k materials.

9. The method of claim 6, further comprising:
    etching back the conductive material to expose the sidewall of the second spacer.

10. The method of claim 9, wherein the dielectric cap over the conductive material is in contact with the sidewall of the second spacer.

11. The method of claim 9, further comprising:
    forming a contact plug to be in contact with the conductive material and a top surface of the second spacer.

12. A method comprising:
    providing a workpiece comprising:
        a gate structure over a substrate;
        a source/drain epitaxial structure over the substrate;
        a first spacer between the gate structure and the source/drain epitaxial structure; and
        a second spacer over the first spacer, wherein a top surface of the first spacer is lower than a top surface of the second spacer, and a width of the second spacer is greater than a width of the first spacer;
    forming an interlayer dielectric (ILD) layer over the workpiece;
    forming a contact hole in the ILD layer to expose the second spacer and the gate structure, wherein the contact hole further exposes the first spacer; and
    filling a conductive material in the contact hole.

13. The method of claim 12, further comprising:
    forming a contact etch stop layer (CESL) over the workpiece prior to forming the ILD layer.

14. The method of claim 12, wherein the top surface of the first spacer is higher than a top surface of the gate structure.

15. The method of claim 12, wherein the second spacer is in contact with the gate structure.

16. The method of claim 12, wherein the workpiece further has an air gap between the first spacer and the gate structure.

17. The method of claim 1, wherein an air gap is formed between the lower step of the second spacer and a top surface of the substrate.

18. The method of claim 1, further comprising:
    forming an interlayer dielectric layer over the gate structure; and
    forming a contact hole in the interlayer dielectric layer to expose the second spacer and the gate structure.

19. The method of claim 1, wherein removing the third spacer comprises removing a top portion of the third spacer when removing the top portion of the first spacer.

20. The method of claim 19, wherein after removing the top portion of the third spacer and prior to forming the second spacer, an entirety of the third spacer is removed.

* * * * *